(12) United States Patent
Yun et al.

(10) Patent No.: US 12,733,378 B2
(45) Date of Patent: Sep. 8, 2026

(54) DISPLAY DEVICE HAVING SUBSTRATE WITH INCLINED SURFACE, AND ELECTRONIC DEVICE INCLUDING THE SAME

(71) Applicant: Samsung Display Co., Ltd., Yongin-si (KR)

(72) Inventors: Daesang Yun, Yongin-si (KR); Wanjung Kim, Yongin-si (KR); Kyungah Nam, Yongin-si (KR); Hyoyoung Mun, Yongin-si (KR); Yongseung Park, Yongin-si (KR); Yiseul Um, Yongin-si (KR); Soyoung Lee, Yongin-si (KR); Younghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 484 days.

(21) Appl. No.: 18/317,792

(22) Filed: May 15, 2023

(65) Prior Publication Data

US 2023/0371346 A1 Nov. 16, 2023

(30) Foreign Application Priority Data

May 16, 2022 (KR) ........................ 10-2022-0059831
May 30, 2022 (KR) ........................ 10-2022-0066350

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02)

(58) Field of Classification Search
CPC ............. H10K 59/873; H10K 59/1201; H10K 59/871; H10K 77/10; H10K 71/851;
(Continued)

(56) References Cited

U.S. PATENT DOCUMENTS 9,102,007 B2 8/2015 Hosseini
9,301,417 B2 * 3/2016 Lee ....................... G02F 1/1339
(Continued)

FOREIGN PATENT DOCUMENTS

CN 108623180 A 10/2018
CN 112358193 A 2/2021
(Continued)

OTHER PUBLICATIONS

EPO Extended European Search Report dated Nov. 28, 2023, issued in corresponding European Patent Application No. 23173285.0 (8 pages).

*Primary Examiner* — Caleb E Henry
(74) *Attorney, Agent, or Firm* — Womble Bond Dickinson (US) LLP

(57) ABSTRACT

A display device includes: a substrate; a display unit on the substrate; and an encapsulation member on the display unit, wherein the substrate comprises: a first inclined surface inclined with respect to a first surface of the substrate; and a first side surface connected to the first inclined surface and arranged at a predetermined angle from the first inclined surface, wherein a surface roughness of the first side surface is different from a surface roughness of the first inclined surface.

18 Claims, 19 Drawing Sheets

(58) Field of Classification Search
CPC ..... C03C 15/00; C03C 23/0025; B23K 26/53; B23K 26/03; B23K 26/0604; B23K 26/083; B23K 26/0876; B23K 2103/56; H01L 21/67092; H01L 21/67259; H01L 21/304; H01L 21/681; H01L 21/68764
See application file for complete search history.

(56) References Cited

U.S. PATENT DOCUMENTS 11,205,769 B2 12/2021 Lee et al.
11,495,771 B2 11/2022 Jo et al.
11,616,217 B2 * 3/2023 Jo .......................... H10K 77/10 257/72
2007/0072393 A1 * 3/2007 Aspar ............... H01L 21/76254 438/459
2008/0044984 A1 * 2/2008 Hsieh .................... H10F 39/026 438/459
2008/0238957 A1 * 10/2008 Hayashi ............... B41J 2/17509 347/85
2008/0239029 A1 * 10/2008 Hayashi ............... B41J 2/17513 347/3
2008/0297550 A1 * 12/2008 Igarashi ................. B41J 2/2132 347/12
2009/0033700 A1 * 2/2009 Kusumoto ............... B41J 2/175 347/12
2009/0042363 A1 * 2/2009 Miyazaki .......... H01L 21/76256 438/459
2009/0058915 A1 * 3/2009 Hayashi ................... B41J 2/175 347/17
2009/0058925 A1 * 3/2009 Hayashi ............... B41J 2/16532 347/30
2012/0135177 A1 5/2012 Cornejo et al.
2012/0299219 A1 11/2012 Shimoi et al.
2015/0140785 A1 * 5/2015 Kwak ..................... H01L 21/78 438/464
2016/0064229 A1 * 3/2016 Kim ..................... B28D 5/0011 225/2
2018/0233707 A1 * 8/2018 Mine .................... H10K 71/135
2020/0266395 A1 * 8/2020 Jo ...................... H10K 59/8731
2021/0114925 A1 4/2021 Park et al.
2022/0127186 A1 * 4/2022 Chou .................... C03C 17/324

FOREIGN PATENT DOCUMENTS

EP 3754738 A1 12/2020
JP 2019-159178 A 9/2019
KR 10-2020-0100914 A 8/2020
KR 10-2020-0109422 A 9/2020
KR 10-2020-0145881 A 12/2020
KR 10-2021-0048000 A 5/2021
WO WO 2015/016082 A1 2/2015

* cited by examiner

DISPLAY DEVICE HAVING SUBSTRATE WITH INCLINED SURFACE, AND ELECTRONIC DEVICE INCLUDING THE SAME

CROSS-REFERENCE TO RELATED APPLICATIONS

The present application claims priority to and the benefit of Korean Patent Application No. 10-2022-0059831, filed on May 16, 2022, and Korean Patent Application No. 10-2022-0066350, filed on May 30, 2022, in the Korean Intellectual Property Office, the entire disclosure of each of which is incorporated herein by reference.

BACKGROUND

1. Field

Aspects of one or more embodiments relate to a device and method, and for example, to a display device, an electronic device, and a method of manufacturing the display device.

2. Description of the Related Art

Electronic devices based on mobility are widely used. As mobile electronic devices, in addition to small electronic devices, such as mobile phones, tablet personal computers (PC) have been widely used in recent years.

Such a mobile electronic device generally includes a display device that supports various functions and displays visual information, such as an image or a video, to a user. Recently, as the size of other components for driving a display device has been reduced, the proportion of the display device in an electronic device has gradually increased, and a structure that may be bent to a certain angle (e.g., a set or predetermined angle) from a flat state has been developed.

The above information disclosed in this Background section is only for enhancement of understanding of the background and therefore the information discussed in this Background section does not necessarily constitute prior art.

SUMMARY

When manufacturing a display device, a substrate of the display device may be divided in various ways. When the substrate is bent or a physical force is applied to the substrate when the substrate is divided into a plurality of substrates, the thickness of the substrate may be too thick or the substrate may not be cleanly cut, and accordingly, cracks may occur at a cutting surface of the substrate. In such situations, the lifespan of the display device may be shortened, or a malfunction or failure of the display device may be induced due to cracks occurring in the substrate.

One or more embodiments include a display device, an electronic device, and a method of manufacturing the display device, wherein cracks occurring in the substrate during division of the substrate are prevented or reduced by reducing the thickness of a substrate and dividing the substrate into a plurality of substrates.

Additional aspects will be set forth in part in the description which follows and, in part, will be apparent from the description, or may be learned by practice of the presented embodiments of the disclosure.

According to one or more embodiments, a display device includes a substrate, a display unit on the substrate, and an encapsulation member on the display unit, wherein the substrate includes a first inclined surface inclined with respect to a surface of the substrate, and a first side surface connected to the first inclined surface and arranged at a predetermined angle from the first inclined surface, wherein a surface roughness of the first side surface is different from a surface roughness of the first inclined surface.

According to some embodiments, a surface roughness of a surface of the substrate, the surface being connected to the first inclined surface, may be different from the surface roughness of the first inclined surface.

According to some embodiments, the substrate may further include a second inclined surface connected to the first side surface and inclined with respect to a surface of the substrate.

According to some embodiments, an angle of the first inclined surface with respect to one surface of the substrate may be different from an angle of the second inclined surface with respect to other surface of the substrate.

According to some embodiments, a sum of a first angle between one surface of the substrate and the first inclined surface, a second angle between the first inclined surface and the first side surface, and a third angle between other surface of the substrate and the second inclined surface may be less than 450 degrees, the other surface being opposite to the one surface.

According to some embodiments, a height from one surface of the substrate to an end of the first inclined surface may be less than half of a thickness of the substrate.

According to some embodiments, the encapsulation member may include a thin-film encapsulation layer.

According to some embodiments, the encapsulation member may include an encapsulation substrate arranged to face the substrate, and a sealing portion arranged between the substrate and the encapsulation substrate and sealing the display unit.

According to some embodiments, the encapsulation substrate may include a third inclined surface inclined with respect to a surface of the encapsulation substrate, and a second side surface connected to the third inclined surface and arranged at a predetermined angle from the third inclined surface.

According to some embodiments, a surface roughness of the second side surface may be different from a surface roughness of the third inclined surface.

According to some embodiments, a surface roughness of a surface of the encapsulation substrate, the surface being connected to the third inclined surface, may be different from the surface roughness of the third inclined surface.

According to some embodiments, the encapsulation substrate may further include a fourth inclined surface connected to the second side surface and inclined with respect to a surface of the encapsulation substrate.

According to some embodiments, an angle of the third inclined surface with respect to the second side surface may be different from an angle of the fourth inclined surface with respect to the second side surface.

According to some embodiments, a sum of a fourth angle between one surface of the encapsulation substrate and the third inclined surface, a fifth angle between the third inclined surface and the second side surface, and a sixth angle between other surface of the encapsulation substrate and the fourth inclined surface may be less than 450 degrees, the other surface being opposite to the one surface of the encapsulation substrate.

According to some embodiments, a height from a surface of the encapsulation substrate to an end of the third inclined surface may be less than half of a thickness of the encapsulation substrate.

According to some embodiments, the third inclined surface may include a plurality of inclined surface having different angles from each other with respect to a surface of the encapsulation substrate.

According to some embodiments, the first inclined surface may include a plurality of inclined surfaces having different angles from each other with respect to a surface of the substrate.

According to some embodiments, an electronic device includes a cover member, a cover coupled to the cover member, and a display device arranged inside the cover member and the cover, wherein the display device includes a display device according to any one of one or more embodiments.

According to some embodiments, a method of manufacturing a display device includes forming a cutting surface in a thickness direction of a base substrate by irradiating a laser to a first surface of the base substrate, the base substrate having the first surface on which a plurality of display units are located and a second surface facing the first surface, attaching a film member on the first surface, and dividing the base substrate into a plurality of substrates along the cutting surface by spraying an etching solution on the second surface of the base substrate.

According to some embodiments, the method may further include irradiating the laser to the base substrate along an edge of each of the plurality of display units such that the base substrate is apart from the edge of each of the plurality of display units.

According to some embodiments, the method may further include reducing a thickness of the base substrate by spraying the etching solution on the second surface of the base substrate.

According to some embodiments, the method may further include forming a first inclined surface inclined with respect to the cutting surface while meeting the cutting surface.

According to some embodiments, the method may further include connecting the cutting surface to the first surface of the base substrate and forming a second inclined surface inclined with respect to the cutting surface.

According to some embodiments, a sum of a first angle formed by the second surface and the first inclined surface, a second angle formed by the first inclined surface and the cutting surface, and a third angle formed by the second inclined surface and the second surface may be less than 450 degrees.

According to some embodiments, a distance from a surface of the substrate to a portion where the first inclined surface and the cutting surface are connected to each other may be less than half of a thickness of the substrate.

According to some embodiments, the method may further include forming a thin-film encapsulation layer on each of a plurality of display units.

According to some embodiments, the first inclined surface may include a plurality of inclined surfaces having different angles from each other with respect to a surface of the substrate.

According to some embodiments, a method of manufacturing a display device includes forming a plurality of display units on a base substrate, arranging a sealing portion on a periphery of each of the plurality of display units to shield each display unit, and attaching an encapsulation base substrate to the sealing portion, forming a cutting surface on at least one of a surface of the base substrate or a surface of the encapsulation base substrate by irradiating a laser to at least one of the surface of the base substrate or the surface of the encapsulation base substrate, and dividing the at least one of the base substrate or the encapsulation base substrate, on which the cutting surface is located, by spraying an etching solution on a surface of the at least one of the base substrate or the encapsulation base substrate, on which the cutting surface is located.

According to some embodiments, the cutting surface may be on at least one of a surface of the base substrate or a surface of the encapsulation base substrate, the surface of the base substrate and the surface of the encapsulation substrate facing each other.

According to some embodiments, the method may further include forming a first inclined surface inclined with respect to the cutting surface by supplying the etching solution to the at least one of the base substrate or the encapsulation base substrate, on which the cutting surface is located.

According to some embodiments, the method may further include forming a second inclined surface, which is arranged to face the first inclined surface, connected to the cutting surface, and inclined with respect to the cutting surface, on at least one of the base substrate or the encapsulation base substrate.

According to some embodiments, a sum of an angle formed by one surface of the base substrate and the first inclined surface, an angle formed by the cutting surface and the first inclined surface, and an angle formed by other surface of the base substrate and the second inclined surface may be less than 450 degrees.

According to some embodiments, a sum of an angle formed by one surface of the encapsulation base substrate and the first inclined surface, an angle formed by the cutting surface and the first inclined surface, and an angle formed by other surface of the encapsulation base substrate and the second inclined surface may be less than 450 degrees.

According to some embodiments, a first thickness of at least one of the base substrate or the encapsulation base substrate may be greater than a second thickness, which is a thickness from a surface of at least one of the base substrate or the encapsulation base substrate to the first inclined surface and the cutting surface.

According to some embodiments, the first inclined surface may include a plurality of inclined surfaces having different angles from each other with respect to a surface of the base substrate or a surface of the encapsulation base substrate.

According to some embodiments, the etching solution may be supplied to an entire surface of at least one of the base substrate or the encapsulation base substrate to reduce a thickness of at least one of the base substrate or the encapsulation base substrate.

Other aspects, features, and characteristics other than those described above will now become apparent from the following drawings, claims, and the detailed description of the disclosure.

These general and specific aspects may be embodied using a system, a method, a computer program, or a combination of any system, method, and computer program.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
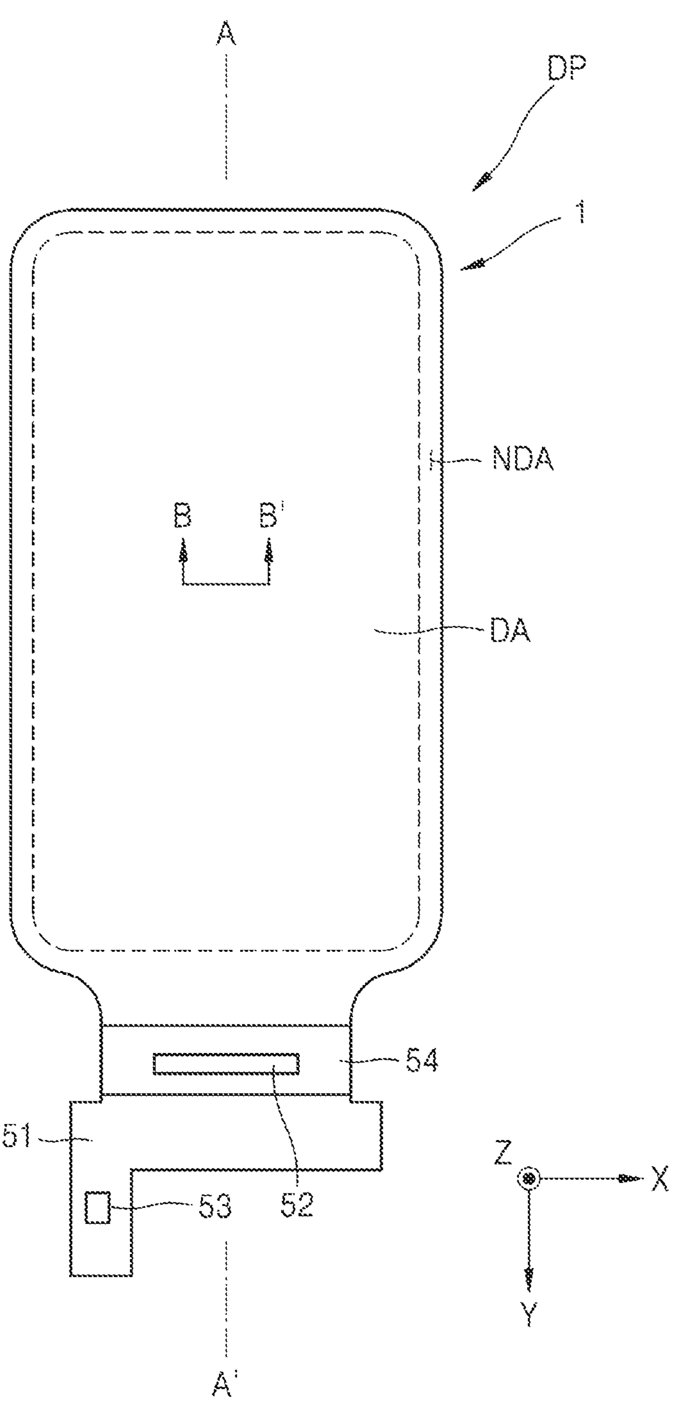
FIG. 1 is a schematic plan view of a display device according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

Aspects of some embodiments of the present disclosure will now be described more fully with reference to the accompanying drawings, in which embodiments of the disclosure are shown. Like reference numerals in the drawings denote like elements, and thus their description will be omitted.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The x, y, and z axes are not limited to three axes on the orthogonal coordinates system, and may be interpreted in a broad sense including the same. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a schematic plan view of a display device 1 according to some embodiments.

Referring to FIG. 1, the display device 1 may include a display panel DP, a display circuit board 51, a display driving unit 52, and a touch sensor driving unit 53. The display panel DP may be a light-emitting display panel including a light-emitting element. For example, the display panel DP may be an organic light-emitting display panel using an organic light-emitting diode including an organic emission layer, a micro light-emitting diode display panel using a micro light-emitting diode (LED), a quantum dot light-emitting display panel using a quantum dot LED including a quantum dot emission layer, or an inorganic light-emitting display panel using an inorganic light-emitting element including an inorganic semiconductor.

The display panel DP may be a transparent display panel that is implemented to be transparent, such that an object or a background on the lower surface of the display panel DP is visible from the upper surface of the display panel DP. Alternatively, the display panel DP may be a reflective display panel, which may reflect an object or a background on the upper surface of the display panel DP.

The display panel DP as described above may include a display area DA that realizes an image and a peripheral area NDA arranged to surround the display area DA. A separate driving circuit, a pad, or the like may be arranged in the peripheral area NDA.

The display circuit board 51 may be attached to the edge on a side of the display panel DP.

The display driving unit 52 may be arranged in various portions of the display device 1. For example, the display driving unit 52 may be located on a substrate of the display panel DP. According to some embodiments, the display driving unit 52 may be located on a flexible film 54. According to some embodiments, the display driving unit 52 may be located on the display circuit board 51. Hereinafter, for convenience of description, a case in which the display driving unit 52 is located on the flexible film 54 is mainly described in detail.

The display driving unit 52 may receive control signals and power voltages, and generate and output signals and power voltages for driving the display panel DP. The display driving unit 52 may be formed as an integrated circuit (IC).

The display circuit board 51 may be attached to the display panel DP. At this time, the display circuit board 51 may be attached to the display panel DP by using the flexible film 54. In this case, the flexible film 54 may be connected to the display panel DP and the display circuit board 51 through an anisotropic conductive film. The display circuit board 51 may be a flexible printed circuit board (FPCB) that may be bent or a composite printed circuit board including both of a rigid printed circuit board (RPCB) that is hard and is not easily bendable and an FPCB.

According to some embodiments, a side of the display circuit board 51 may be directly attached to an edge of the display panel DP by using an anisotropic conductive film. Hereinafter, for convenience of description, a case in which the display circuit board 51 is connected to the display panel DP through the flexible film 54 is mainly described in detail.

The touch sensor driving unit 53 may be located on the display circuit board 51. The touch sensor driving unit 53 may be formed as an IC. The touch sensor driving unit 53 may be attached on the display circuit board 51. The touch sensor driving unit 53 may be electrically connected to touch electrodes in a touch screen layer of the display panel DP through the display circuit board 51.

The touch screen layer of the display panel DP may sense a user's touch input by using at least one of various touch methods, such as a resistive film method, a capacitive method, or the like. For example, when the touch screen layer of the display panel DP senses a user's touch input by using the capacitive method, the touch sensor driving unit 53 may determine whether the user touches, by applying driving signals to driving electrodes among the touch electrodes and sensing voltages charged in mutual capacitances (hereinafter, referred to as "mutual capacities") between the driving electrodes and sensing electrodes through the sensing electrodes among the touch electrodes. The user's touch may include a contact touch and a proximity touch. The contact touch refers to a touch in which an object, such as a user's finger, a pen, or the like, directly contacts a cover member located on the touch screen layer. The proximity touch refers to a touch in which an object, such as a user's finger, a pen, or the like, is positioned proximately on the cover member, such as hovering. The touch sensor driving unit 53 may transmit sensor data to a main processor according to sensed voltages, and the main processor may calculate touch coordinates in which a touch input has occurred by analyzing the sensor data.

A power supply unit configured to supply driving voltages for driving pixels of the display panel DP, a scan driving unit, and the display driving unit 52 may be located above the display circuit board 51. Alternatively, the power supply unit may be integrated with the display driving unit 52, and in this case, the display driving unit 52 and the power supply unit may be formed as one IC.

Figure 2:
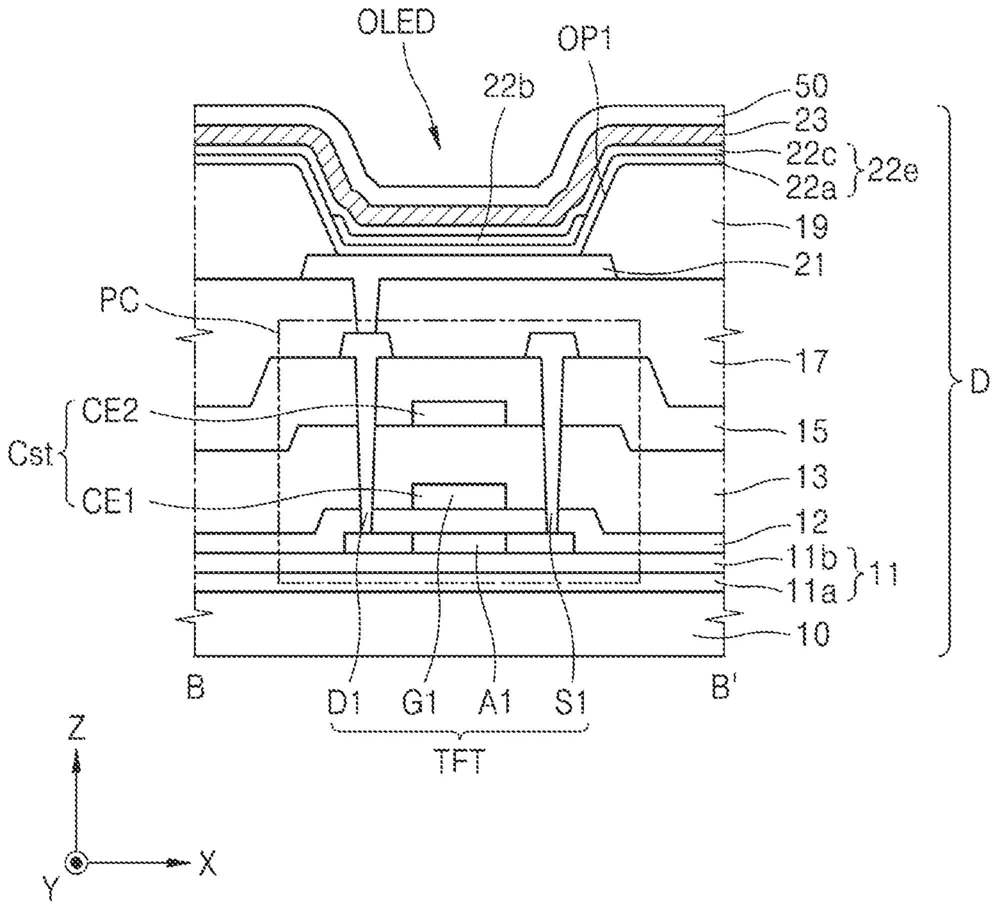
FIG. 2 is a cross-sectional view of the display device taken along the line B-B' shown in FIG. 1 according to some embodiments.

FIG. 2 is a cross-sectional view of the display device 1 taken along line B-B' shown in FIG. 1.

Referring to FIG. 2, the display panel DP may include a display unit D and an encapsulation member. At this time, the display unit D may include a substrate 10, a buffer layer 11, a circuit layer, and a display element layer. The display unit D may include at least one pixel. At this time, the display unit D may correspond to the display area DA shown in FIG. 1. In addition, a plurality of pixels may be included, and the plurality of pixels may be arranged to have columns and rows. Accordingly, the display unit D may express an image to the outside according to an operation of the plurality of pixels.

The encapsulation member may have various shapes. For example, the encapsulation member may include a thin-film encapsulation layer. According to some embodiments, the encapsulation member may include a sealing portion and an encapsulation substrate.

The substrate 10 may include an insulating material, such as glass and/or quartz, or the like. The substrate 10 may be a rigid substrate.

The buffer layer 11 may be positioned on the substrate 10 to reduce or block penetration of a foreign material, moisture, or external air from a lower portion of the substrate 10, and may provide a flat surface on the substrate 10. The buffer layer 11 may include an inorganic material, such as an oxide or a nitride, an organic material, or a composite of an organic material and an inorganic material, and may include a single-layered or multi-layered structure including an inorganic material and an organic material. A barrier layer blocking penetration of external air may be further included between the substrate 10 and the buffer layer 11. In some embodiments, the buffer layer 11 may include silicon oxide ($SiO_2$) or silicon nitride ($SiN_x$). The buffer layer 11 may be provided by stacking a first buffer layer 11*a* and a second buffer layer 11*b*.

The circuit layer may be located on the buffer layer 11, and may include a pixel circuit PC, a first gate insulating layer 12, a second gate insulating layer 13, an interlayer insulating layer 15, and a planarization layer 17. The pixel circuit PC may include a thin-film transistor TFT and a storage capacitor Cst.

The thin-film transistor TFT may be located on the buffer layer 11. The thin-film transistor TFT may include a first semiconductor layer A1, a first gate electrode G1, a first source electrode S1, and a first drain electrode D1. The thin-film transistor TFT may be connected to an organic light-emitting diode OLED to drive the organic light-emitting diode OLED.

The first semiconductor layer A1 may be located on the buffer layer 11, and may include polysilicon. According to some embodiments, the first semiconductor layer A1 may include amorphous silicon. According to some embodiments, the first semiconductor layer A1 may include an oxide of at least one material selected from a group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel area, a source area, and a drain area, wherein the source area and the drain area are doped with impurities.

The first gate insulating layer 12 may be provided to cover the first semiconductor layer A1. The first gate insulating layer 12 may include an inorganic insulating material, such as $SiO_2$, $SiN_x$, silicon oxynitride (SiON), aluminum oxide ($Al_2O_3$), titanium oxide ($TiO_2$), tantalum pentoxide ($Ta_2O_5$), hafnium oxide ($HfO_2$), and/or zinc oxide ($ZnO_x$), or the like. At this time, zinc oxide ($ZnO_x$) may be zinc oxide (ZnO) and/or zinc peroxide ($ZnO_2$). The first gate insulating layer 12 may include a single layer or a multi-layer, each including the inorganic insulating materials stated above.

The first gate electrode G1 is located on the first gate insulating layer 12 to overlap the first semiconductor layer A1. The first gate electrode G1 may include molybdenum (Mo), aluminum (Al), copper (Cu), Ti, or the like, and may include a single layer or a multi-layer. For example, the first gate electrode G1 may have a single Mo layer.

The second gate insulating layer 13 may be provided to cover the first gate electrode G1. The second gate insulating layer 13 may include an inorganic insulating material, such as $SiO_2$, $SiN_x$, SiON, $Al_2O_3$, $TiO_2$, $Ta_2O_5$, $HfO_2$, and/or $ZnO_x$, or the like. At this time, zinc oxide ($ZnO_x$) may be zinc oxide (ZnO) and/or zinc peroxide ($ZnO_2$). The second gate insulating layer 13 may include a single layer or a multi-layer, each including the inorganic insulating materials stated above.

A first upper electrode CE2 of the storage capacitor Cst may be located on the second gate insulating layer 13.

In the display area DA, the first upper electrode CE2 may overlap the first gate electrode G1, which is below the first upper electrode CE2. The first gate electrode G1 and the first upper electrode CE2 may form the storage capacitor Cst, wherein the first gate electrode G1 and the first upper electrode CE2 overlap each other with the second gate insulating layer 13 therebetween. The first gate electrode G1 may be a first lower electrode CE1 of the storage capacitor Cst.

The first upper electrode CE2 may include Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu, and may include a single layer or a multi-layer, each including the materials stated above.

The interlayer insulating layer 15 may be formed to cover the first upper electrode CE2. The interlayer insulating layer 15 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), or the like. At this time, zinc oxide ($ZnO_x$) may be zinc oxide (ZnO) and/or zinc peroxide ($ZnO_2$). The interlayer insulating layer 15 may include a single layer or a multi-layer, each including the inorganic insulating materials stated above.

The first source electrode S1 and the first drain electrode D1 may each be located on the interlayer insulating layer 15. The first source electrode S1 and the first drain electrode D1 may each include a conductive material including Mo, Al, Cu, Ti, or the like, and may each include a multi-layer or a single layer, each including the above materials. For example, the first source electrode S1 and the first drain electrode D1 may each have a multi-layer of Ti/Al/Ti.

The planarization layer 17 may be arranged to cover the first source electrode S1 and the first drain electrode D1. The planarization layer 17 may have a flat surface such that a pixel electrode 21 located on the planarization layer 17 may be formed flat.

The planarization layer 17 may include an organic material or an inorganic material, and may have a single-layered structure or a multi-layered structure. The planarization layer 17 may include a general-purpose polymer, such as benzocyclobutene (BCB), polyimide, hexamethyldisiloxane (HMDSO), polymethyl methacrylate (PMMA), or polystyrene, a polymer derivative containing a phenol group, an acrylic polymer, an imide polymer, an aryl ether polymer, an amide polymer, a fluorine polymer, a p-xylene polymer, and/or a vinyl alcohol polymer, or the like.

The planarization layer 17 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum pentoxide ($Ta_2O_5$), hafnium oxide ($HfO_2$), and/or zinc oxide ($ZnO_x$), or the like. At this time, zinc oxide ($ZnO_x$) may be zinc oxide (ZnO) and/or zinc peroxide ($ZnO_2$). When forming the planarization layer 17, a layer may be formed, and chemical mechanical polishing may be performed on the upper surface of the layer to provide a flat upper surface.

The planarization layer 17 may have a via hole exposing any one of the first source electrode S1 and the first drain electrode D1 of the thin-film transistor TFT, and the pixel electrode 21 may contact the first source electrode S1 or the first drain electrode D1 through the via hole to be electrically connected to the thin-film transistor TFT.

The pixel electrode 21 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 21 may include a reflective film including Ag, Mg, Al, Pt, Pd, Au, Ni, Nd, Ir, Cr, or a compound thereof. For example, the pixel electrode 21 may have a structure having films including ITO, IZO, ZnO, or $In_2O_3$ above/below the above-stated reflective film. In this case, the pixel electrode 21 may have a stacked structure of ITO/Ag/ITO.

A pixel defining layer 19 may cover an edge of the pixel electrode 21 on the planarization layer 17, and may have a first opening OP1 exposing a central portion of the pixel electrode 21. The size and shape of an emission area of the organic light-emitting diode OLED, that is, a sub-pixel, are defined by the first opening OP1.

The pixel defining layer 19 may prevent an arc or the like from being generated at an edge of the pixel electrode 21 by increasing a distance between the edge of the pixel electrode 21 and an opposite electrode 23 above the pixel electrode 21. The pixel defining layer 19 may be formed of an organic insulating material, such as polyimide, polyamide, acrylic resin, BCB, HMDSO, and/or phenol resin, or the like, by a spin coating method or the like.

An emission layer 22*b* formed to correspond to the pixel electrode 21 may be arranged inside the first opening OP1 of the pixel defining layer 19. The emission layer 22*b* may include a polymer material or a low-molecular-weight material, and may emit red, green, blue, or white light.

An organic functional layer 22*e* may be located on and/or below the emission layer 22*b*. The organic functional layer 22*e* may include a first functional layer 22*a* and/or a second functional layer 22*c*. The first functional layer 22*a* or the second functional layer 22*c* may be omitted.

The first functional layer 22*a* may be located below the emission layer 22*b*. The first functional layer 22*a* may be a single layer or a multi-layer, each including an organic material. The first functional layer 22*a* may be a hole transport layer (HTL) having a single-layered structure. Alternatively, the first functional layer 22*a* may include a hole injection layer (HIL) and an HTL. The first functional layer 22*a* may be integrally formed to correspond to organic light-emitting diodes OLED in the display area DA.

The second functional layer 22*c* may be located on the emission layer 22*b*. The second functional layer 22*c* may be a single layer or a multi-layer, each including an organic material. The second functional layer 22*c* may include an electron transport layer (ETL) and/or an electron injection layer (EIL). The second functional layer 22*c* may be integrally formed to correspond to the organic light-emitting diodes OLED in the display area DA.

The opposite electrode 23 is located on the second functional layer 22*c*. The opposite electrode 23 may include a conductive material having a low work function. For example, the opposite electrode 23 may include a (semi) transparent layer, the (semi)transparent layer including Ag, Mg, Al, Pt, Pd, Au, Ni, Nd, Ir, Cr, lithium (Li), Ca, alloys thereof, or the like. Alternatively, the opposite electrode 23 may further include a layer, such as ITO, IZO, ZnO, or $In_2O_3$, above the (semi)transparent layer including the materials stated above. The opposite electrode 23 may be integrally formed to correspond to the organic light-emitting diodes OLED in the display area DA.

Layers from the pixel electrode 21 to the opposite electrode 23, which are formed in the display area DA, may form the organic light-emitting diode OLED.

An upper layer 50 including an organic material may be formed on the opposite electrode 23. The upper layer 50 may be a layer provided to increase light extraction efficiency while protecting the opposite electrode 23. The upper layer 50 may include an organic material having a higher refractive index than that of the opposite electrode 23. Alternatively, the upper layer 50 may be provided by stacking layers having different refractive indices from each other. For example, the upper layer 50 may be provided by stacking a high-refractive index layer/low-refractive index layer/high-refractive index layer. At this time, the refractive index of the high-refractive index layer may be equal to or greater than 1.7, and the refractive index of the low-refractive layer may be equal to or less than 1.3.

The upper layer 50 may further include lithium fluoride (LiF). Alternatively, the upper layer 50 may further include an inorganic insulating material, such as silicon oxide ($SiO_2$) and silicon nitride ($SiN_x$). The upper layer 50 may also be omitted when necessary. However, hereinafter, for convenience of description, a case in which the upper layer 50 is located on the opposite electrode 23 is mainly described in detail.

According to some embodiments, the display panel DP described above may include the encapsulation member for shielding the upper layer 50.

Figure 3A:
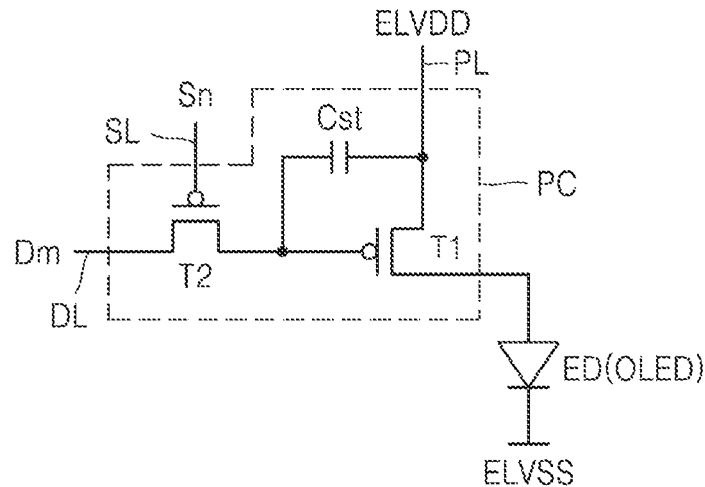
FIGS. 3A and 3B are circuit diagrams each schematically illustrating a circuit of a display panel of the display device of FIG. 1 according to some embodiments.
Figure 3B:
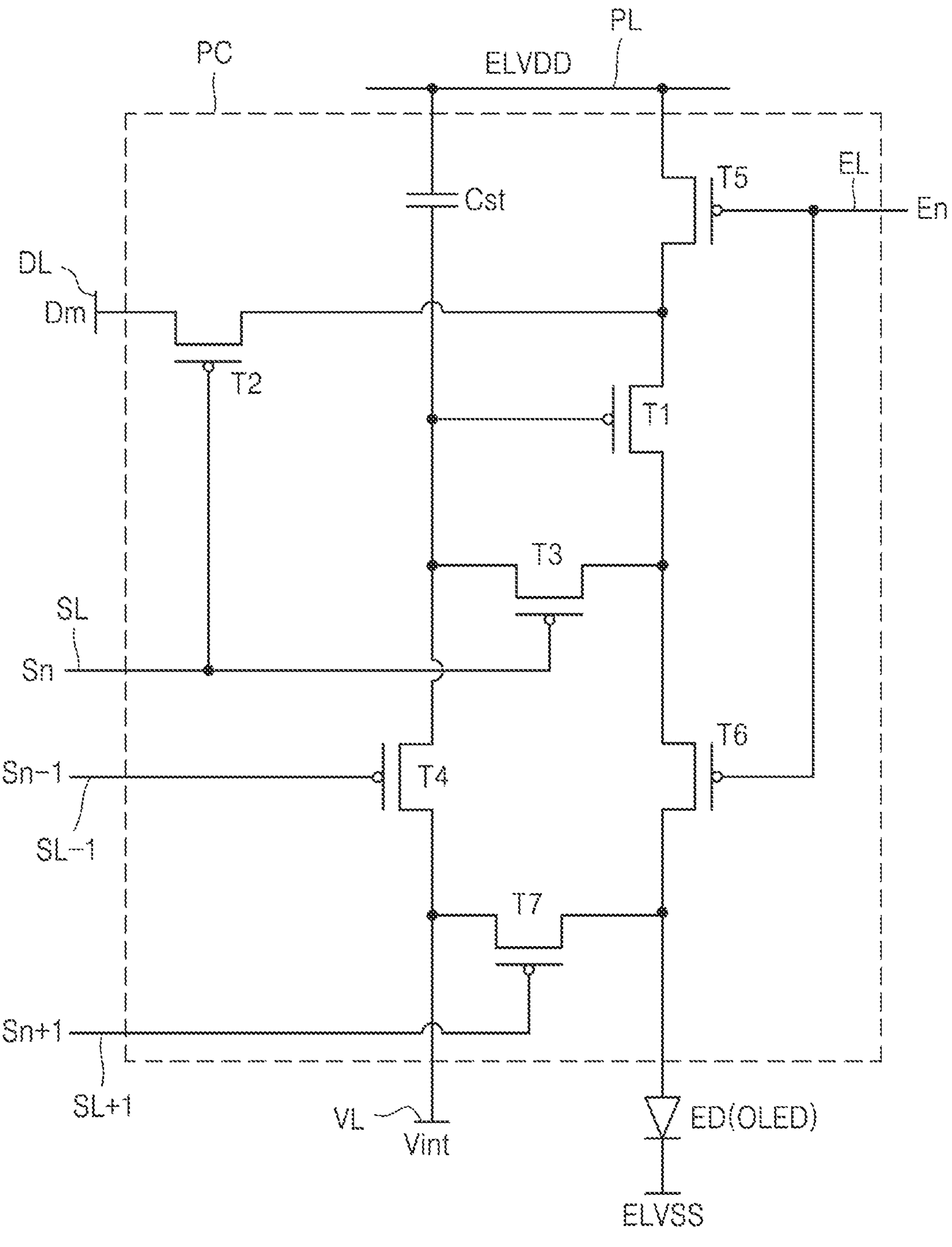

FIGS. 3A and 3B are circuit diagrams each schematically illustrating a circuit of the display panel DP of the display device 1 of FIG. 1.

Referring to FIGS. 3A and 3B, the pixel circuit PC may be connected to a light-emitting element ED to realize light emission of sub-pixels. For example, the light-emitting element ED may be the organic light-emitting diode OLED described with reference to FIG. 2. The pixel circuit PC includes a driving thin-film transistor T1, a switching thin-film transistor T2, and a storage capacitor Cst. The switching thin-film transistor T2 is connected to a scan line SL and a data line DL and configured to deliver, to the driving thin-film transistor T1, a data signal Dm input through the data line DL, according to a scan signal Sn input through the scan line SL.

The storage capacitor Cst is connected to the switching thin-film transistor T2 and a driving voltage line PL, and stores a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst, and may control a driving current flowing from the driving voltage line PL to the light-emitting element ED in accordance with a voltage value stored in the storage capacitor Cst. The light-emitting element ED may emit light having a certain brightness according to the driving current.

Although FIG. 3A illustrates that the pixel circuit PC includes two thin-film transistors and one storage capacitor, the disclosure is not limited to thereto.

Referring to FIG. 3B, the pixel circuit PC may include the driving thin-film transistor T1, the switching thin-film transistor T2, a compensating thin-film transistor T3, a first initialization thin-film transistor T4, an operation-control thin-film transistor T5, an emission-control thin-film transistor T6, and a second initialization thin-film transistor T7.

Although FIG. 3B illustrates that each pixel circuit PC includes signal lines SL, SL−1, SL+1, EL, DL, an initialization voltage line VL, and the driving voltage line PL, the disclosure is not limited thereto. According to some embodiments, at least one of signal lines SL, SL−1, SL+1, EL, and DL, and/or the initialization voltage line VL may be shared by neighboring pixel circuits.

A drain electrode of the driving thin-film transistor T1 may be electrically connected to the light-emitting element ED via the emission-control thin-film transistor T6. The driving thin-film transistor T1 receives the data signal Dm according to a switching operation of the switching thin-film transistor T2 and supplies a driving current to the light-emitting element ED.

A gate electrode of the switching thin-film transistor T2 is connected to the scan line SL, and a source electrode of the switching thin-film transistor T2 is connected to the data line DL. A drain electrode of the switching thin-film transistor T2 may be connected to the driving voltage line PL via the operation-control thin-film transistor T5 while being connected to a source electrode of the driving thin-film transistor T1.

The switching thin-film transistor T2 may be turned on according to the scan signal Sn received through the scan line SL and may perform a switching operation of transferring the data signal Dm received via the data line DL to the source electrode of the driving thin-film transistor T1.

A gate electrode of the compensating thin-film transistor T3 may be connected to the scan line SL. A source electrode of the compensating thin-film transistor T3 may be connected to a pixel electrode of the light-emitting element ED via the emission-control thin-film transistor T6 while being connected to the drain electrode of the driving thin-film transistor T1. A drain electrode of the compensating thin-film transistor T3 may be connected together to any one electrode of the storage capacitor Cst, a source electrode of the first initialization thin-film transistor T4, and a gate electrode of the driving thin-film transistor T1. The compensating thin-film transistor T3 is turned on according to the scan signal Sn received through the scan line SL and connect the gate electrode and the drain electrode of the driving thin-film transistor T1 to each other to diode-connect the driving thin-film transistor T1.

A gate electrode of the first initialization thin-film transistor T4 may be connected to a previous scan line SL−1. A drain electrode of the first initialization thin-film transistor T4 may be connected to an initialization voltage line VL. A source electrode of the first initialization thin-film transistor T4 may be connected together to any one electrode of the storage capacitor Cst, the drain electrode of the compensating thin-film transistor T3, and the gate electrode of the driving thin-film transistor T1. The first initialization thin-film transistor T4 may be turned on according to a previous scan signal Sn−1 received through the previous scan line SL−1 and configured to transfer an initialization voltage Vint to the gate electrode of the driving thin-film transistor T1 to perform an initialization operation of initializing a voltage of the gate electrode of the driving thin-film transistor T1.

A gate electrode of the operation-control thin-film transistor T5 may be connected to an emission-control line EL. A source electrode of the operation-control thin-film transistor T5 may be connected to the driving voltage line PL. A drain electrode of the operation-control thin-film transistor T5 may be connected to the source electrode of the driving thin-film transistor T1 and the drain electrode of the switching thin-film transistor T2.

A gate electrode of the emission-control thin-film transistor T6 may be connected to the emission-control line EL. A source electrode of the emission-control thin-film transistor T6 may be connected to the drain electrode of the driving thin-film transistor T1 and the source electrode of the compensating thin-film transistor T3. A drain electrode of the emission-control thin-film transistor T6 may be electrically connected to the pixel electrode of the light-emitting element ED. The operation-control thin-film transistor T5 and the emission-control thin-film transistor T6 are simultaneously turned on according to an emission-control signal En received through the emission-control line EL, the driving voltage ELVDD is transferred to the light-emitting element ED, and a driving current flows through the light-emitting element ED.

A gate electrode of the second initialization thin-film transistor T7 may be connected to a following scan line SL+1. A source electrode of the second initialization thin-film transistor T7 may be connected to the pixel electrode of the light-emitting element ED. A drain electrode of the second initialization thin-film transistor T7 may be connected to the initialization voltage line VL. The second initialization thin-film transistor T7 may be turned on according to a following scan signal Sn+1 received through the following scan line SL+1 to initialize the pixel electrode of the light-emitting element ED.

Although FIG. 3B illustrates a case in which the first initialization thin-film transistor T4 and the second initialization thin-film transistor T7 are respectively connected to the previous scan line SL−1 and the following scan line SL+1, the disclosure is not limited thereto. According to some embodiments, both of the first initialization thin-film transistor T4 and the second initialization thin-film transistor T7 may be connected to a previous scan line SL−1 to be driven according to the previous scan signal Sn−1.

The other electrode of the storage capacitor Cst may be connected to the driving voltage line PL. Any one electrode of the storage capacitor Cst may be connected together to the gate electrode of the driving thin-film transistor T1, the drain electrode of the compensating thin-film transistor T3, and the source electrode of the first initialization thin-film transistor T4.

An opposite electrode (e.g., a cathode) of the light-emitting element ED receives a common voltage ELVSS. The light-emitting element ED receives a driving current from the driving thin-film transistor T1 to emit light.

The pixel circuit PC is not limited to the numbers of thin-film transistors and storage capacitors and the circuit design described with reference to FIGS. 3A and 3B, and the numbers of thin-film transistors and storage capacitors and the circuit design may be variously changed.

Figure 4:
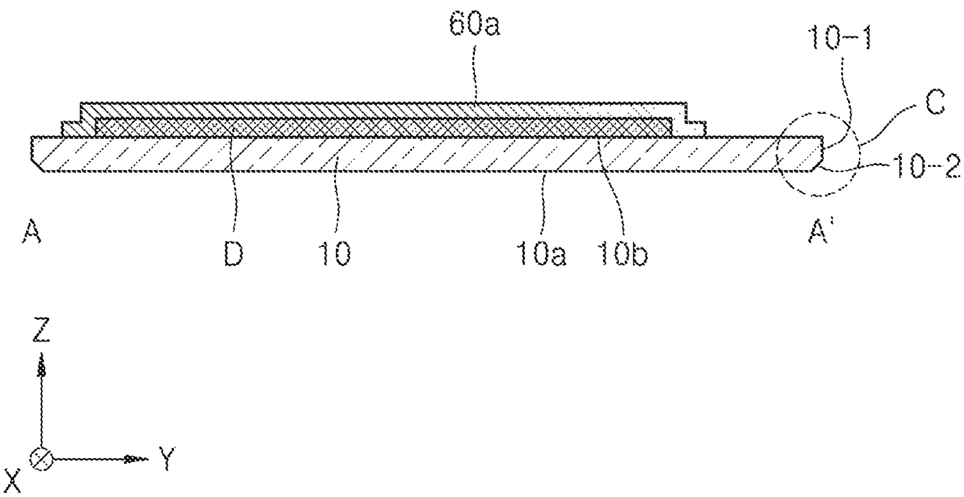
FIG. 4 is a cross-sectional view of the display device taken along the line A-A' shown in FIG. 1 according to some embodiments.

FIG. 4 is a cross-sectional view of the display device 1 taken along line A-A' shown in FIG. 1.

Referring to FIG. 4, the display panel DP may include the substrate 10, the display unit D, and a thin-film encapsulation layer 60*a*. At this time, the substrate 10 and the display unit D may be the same as or similar to those described with reference to FIG. 2. The substrate 10 as described above may include a first surface 10*a* on which the display unit D is not located, and a second surface 10*b* on which the display unit D is located. At this time, an edge of the substrate 10 may be in a partially bent state. For example, an edge between a side surface 10-1 and the first surface 10*a* of the substrate 10 may be inclined. At this time, an inclined surface 10-2 may connect the first surface 10*a* and the side surface 10-1 of the substrate 10 to each other. According to some embodiments, an edge between the side surface 10-1 and the second surface 10*b* of the substrate 10 may also be inclined. According to some embodiments, an edge between the side surface 10-1 and the first surface 10*a* of the substrate 10 and an edge between the side surface 10-1 and the second surface 10*b* of the substrate 10 may be inclined. In this case, the side surface 10-1 of the substrate may be at least a portion of an edge of the display panel DP in the plan view of FIG. 1. That is, a cross-section shown in FIG. 4 means a cross-section taken along line A-A' of FIG. 1, but may also mean a cross-section taken from various directions in FIG. 1, such as a cross-section taken in a direction (e.g., an x-axis direction of FIG. 1) of line B-B' of FIG. 1, a cross-section taken based on a line passing between an X-axis and a Y-axis, or the like. Hereinafter, for convenience of description, a case in which the side surface 10-1 of the substrate 10 means all edges of the display panel DP is mainly described in detail. The thin-film encapsulation layer 60*a* may be located on the display unit D. At this time, the thin-film encapsulation layer 60*a* may be arranged to directly contact the upper layer 50. At this time, the thin-film encapsulation layer 60*a* may cover a portion of the display area DA and the peripheral area NDA to prevent penetration of external moisture and oxygen. The thin-film encapsulation layer 60*a* may include at least one organic encapsulation layer and at least one inorganic encapsulation layer. Hereinafter, for convenience of description, a case in which the thin-film encapsulation layer 60*a* includes a first inorganic encapsulation layer, an organic encapsulation layer, and a second inorganic encapsulation layer, which are sequentially stacked on an upper surface of the upper layer 50, is mainly described in detail.

In this case, the first inorganic encapsulation layer may cover the opposite electrode 23 or the upper layer 50 shown in FIG. 2 and may include silicon oxide, silicon nitride, and/or silicon oxynitride, or the like. Because the first inorganic encapsulation layer is formed along an underlying structure, an upper surface of the first inorganic encapsulation layer is not flat. The organic encapsulation layer covers the first inorganic encapsulation layer, and unlike the first inorganic encapsulation layer, an upper surface of the organic encapsulation layer may be substantially flat. In detail, the organic encapsulation layer may have a substantially flat upper surface in a portion thereof corresponding to the display area DA. The organic encapsulation layer may include at least one material selected from a group consisting polyethylene terephthalate, polyethylene naphthalate, polycarbonate, polyimide, polyethylene sulfonate, polyoxymethylene, polyarylate, and HMDSO. The second inorganic encapsulation layer may cover the organic encapsulation layer, and may include silicon oxide, silicon nitride, and/or silicon oxynitride, or the like.

A touch screen layer may be located on the thin-film encapsulation layer 60*a* as described above.

Figure 5A:
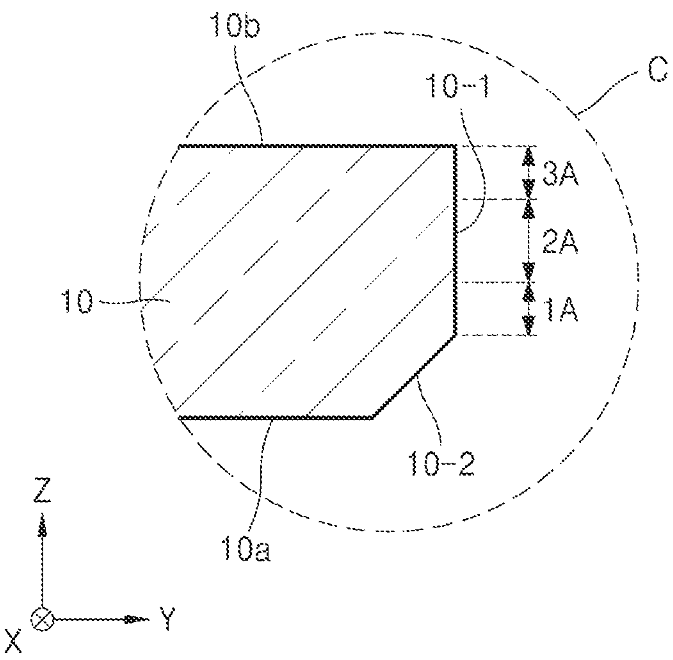
FIGS. 5A to 5C are enlarged cross-sectional views each illustrating a region C of FIG. 4 according to some embodiments.
Figure 5B:
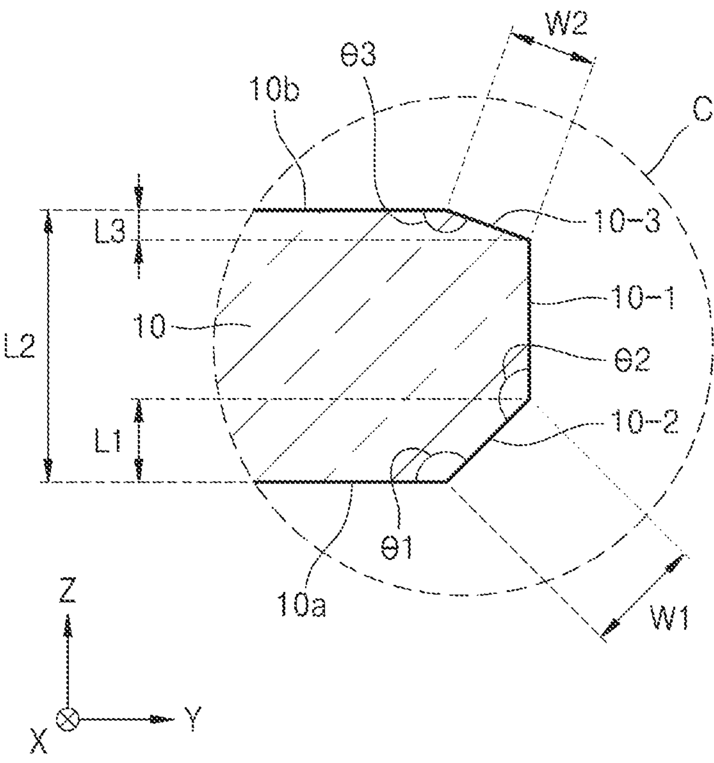
Figure 5C:
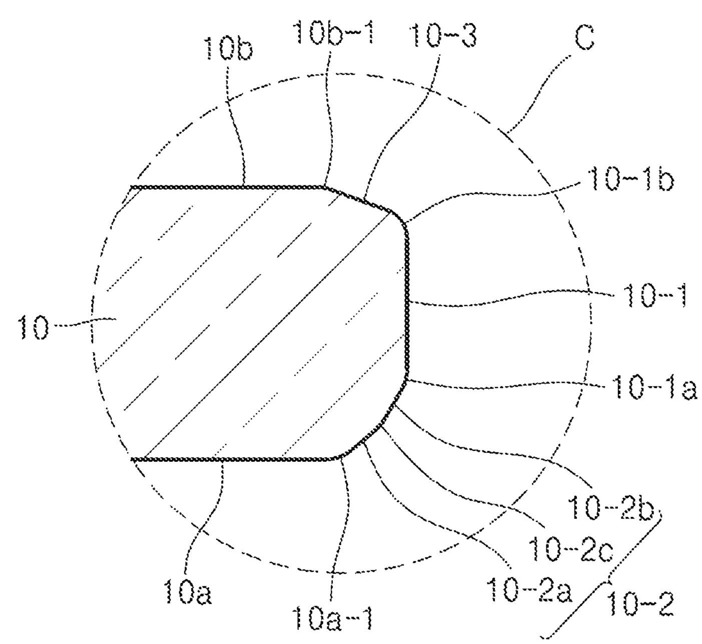

FIGS. 5A to 5C are enlarged cross-sectional views each illustrating a region C of FIG. 4.

Referring to FIG. 5A, a first inclined surface 10-2 may be between the first surface 10*a* and the side surface 10-1 of the substrate 10. At this time, the first inclined surface 10-2 may form a certain angle (e.g., a set or predetermined angle) with respect to the first surface 10*a*.

The surface roughness of the side surface 10-1 of the substrate 10 may be different from the surface roughness of the first surface 10*a*. For example, the surface roughness of the side surface 10-1 of the substrate 10 may be greater than the surface roughness of the first surface 10*a*. The surface roughness of the side surface 10-1 of the substrate 10 may be different from the surface roughness of the second surface 10*b*. For example, the surface roughness of the side surface 10-1 of the substrate 10 may be greater than the surface roughness of the second surface 10*b*.

The surface roughness of the side surface 10-1 of the substrate 10 may be different from the surface roughness of the first inclined surface 10-2. For example, the surface roughness of the side surface 10-1 of the substrate 10 may be less than the surface roughness of the first inclined surface 10-2. At this time, the surface roughness of the first inclined surface 10-2 may be equal to or greater than the surface roughness of the first surface 10*a*.

The surface roughness of the side surface 10-1 of the substrate 10 may be different for each portion. For example, the side surface 10-1 of the substrate 10 may include a first area 1A, a second area 2A, and a third area 3A. At this time, one of the surface roughness of the first area 1A, the surface roughness of the second area 2A, and the surface roughness of the third area 3A may be different from another one of the surface roughness of the first area 1A, the surface roughness of the second area 2A, and the surface roughness of the third area 3A. For example, the surface roughness of the first area 1A may be similar to the surface roughness of the second area 2A. The surface roughness of the first area 1A may be greater than the surface roughness of the third area 3A. In addition, the surface roughness of the second area 2A may be greater than the surface roughness of the third area 3A. In detail, the surface roughness of each of the first area 1A and the second area 2A may be about 400 nm to about 500 nm, and the surface roughness of the third area 3A may be equal to or less than 300 nm. In this case, the surface roughness of each area may mean an average surface roughness Ra of a centerline between a highest point and a lowest point.

In this case, as shown in FIG. 5B, in FIG. 5A as well, a first thickness L1 from the first surface 10*a* to a point where the first inclined surface 10-2 and the side surface 10-1 of the substrate 10 are connected to each other may be less than ½ with respect to a second thickness L2, which is a total thickness of the substrate 10. At this time, when the first thickness L1 is equal to or greater than ½ of the second thickness L2, the length of the first inclined surface 10-2 becomes too long, and thus, a point where the first surface 10*a* and the first inclined surface 10-2 meet may protrude too much.

According to some embodiments, a boundary between the first surface 10*a* and the first inclined surface 10-2, a boundary between the first inclined surface 10-2 and the side surface 10-1, and a boundary between the side surface 10-1 and the second surface 10*b* may be formed to be round, as shown in FIG. 5C to be described below.

Referring to FIG. 5B, the first inclined surface 10-2 may be between the first surface 10*a* and the side surface 10-1 of the substrate 10. In addition, a second inclined surface 10-3 may be between the second surface 10*b* and the side surface 10-1 of the substrate 10.

In this case, the surface roughness of the side surface 10-1 of the substrate may be different from the surface roughness of the first surface 10*a*. For example, the surface roughness of the side surface 10-1 of the substrate 10 may be greater than the surface roughness of the first surface 10*a*. The surface roughness of the side surface 10-1 of the substrate 10 may be different from the surface roughness of the second surface 10*b*. For example, the surface roughness of the side surface 10-1 of the substrate 10 may be greater than the surface roughness of the second surface 10*b*. In this case, the surface roughness of the side surface 10-1 may have a form similar to that described with reference to FIG. 5A.

The surface roughness of the side surface 10-1 of the substrate 10 may be different from the surface roughness of the first inclined surface 10-2. For example, the surface roughness of the side surface 10-1 of the substrate 10 may be less than the surface roughness of the first inclined surface 10-2. At this time, the surface roughness of the first inclined surface 10-2 may be greater than the surface roughness of the first surface 10*a*. In addition, the surface roughness of the first inclined surface 10-2 may be the same as or similar to the surface roughness of the second inclined surface 10-3. In this case, the surface roughness of the side surface 10-1 of the substrate 10 may be similar to that described with reference to FIG. 5A.

In this case, the first thickness L1 from the first surface 10*a* to a point where the first inclined surface 10-2 and the side surface 10-1 of the substrate 10 are connected to each other may be less than ½ with respect to the second thickness L2, which is the total thickness of the substrate 10.

In this case, a sum of a first angle 81 formed by the first inclined surface 10-2 and the first surface 10*a*, a second angle 82 formed by the side surface 10-1 of the substrate 10 and the first inclined surface 10-2, and a third angle 83 formed by the second inclined surface 10-3 and the second surface 10*b* may be less than 450°. At this time, the first angle θ1 may be different from the third angle 83.

In this case, the first inclined surface 10-2 may be different from the second inclined surface 10-3. For example, a first length W1 of the first inclined surface 10-2 may be greater than a second length W2 of the second inclined surface 10-3. In addition, the first thickness L1 from the first surface 10*a* to an end of the first inclined surface 10-2 may be greater than a third thickness L3 from the second surface 10*b* to an end of the second inclined surface 10-3.

Referring to FIG. 5C, an edge end of the substrate 10 may include the first inclined surface 10-2 or may include the first inclined surface 10-2 and the second inclined surface 10-3. Hereinafter, for convenience of description, a case where the edge end of the substrate 10 includes the first inclined surface 10-2 and the second inclined surface 10-3 is mainly described in detail.

In this case, the first inclined surface 10-2 may include at least two inclined surfaces. In this case, the at least two inclined surfaces may have different angles with respect to the first surface 10*a* or the second surface 10*b*.

For example, the first inclined surface 10-2 may include a first-1 inclined surface 10-2*a* and a first-2 inclined surface 10-2*b*. In this case, the first-1 inclined surface 10-2*a* and the first-2 inclined surface 10-2_b_ may have different angles with respect to the first surface 10_a_ or the second surface 10_b_. In particular, an angle formed by the first-1 inclined surface 10-2_a_ and the first surface 10_a_ may be greater than an angle formed by the first-2 inclined surface 10-2_b_ and the first surface 10_a_. In this case, the first inclined surface 10-2 is not limited thereto. The first inclined surface 10-2 may include at least two inclined surfaces, and may include all cases in which one of at least two inclined surfaces and the other one of the at least two inclined surfaces are formed to have different angles with respect to the first surface 10_a_ or the second surface 10_b_. In addition, in this case, as shown in FIG. 5A, the first area 1A, the second area 2A, and the third area 3A may respectively correspond to that at least two inclined surfaces of the first inclined surface 10-2. According to some embodiments, one of the first area 1A, the second area 2A, and the third area 3A may be arranged in the first inclined surface 10-2, another one of the first area 1A, the second area 2A, and the third area 3A may be arranged in the side surface 10-1, and the other one of the first area 1A, the second area 2A, and the third area 3A may be arranged in the second inclined surface 10-3.

In this case, at least one of a first point 10_a_-1 where the first-1 inclined surface 10-2_a_ and the first surface 10_a_ meet, a second point 10-2_c_ where the first-1 inclined surface 10-2_a_ and the first-2 inclined surface 10-2_b_ meet, a third point 10-1_a_ where the first-2 inclined surface 10-2_b_ and the side surface 10-1 meet, a fourth point 10-1_b_ where the side surface 10-1 and the second inclined surface 10-3 meet, or a fifth point 10_b_-1 where the second inclined surface 10-3 and the second surface 10_b_ meet may be formed to be round.

According to some embodiments, the side surface 10-1 may also include at least one inclined surface. In this case, an inclined surface arranged on the side surface 10-1 may be connected to the first-2 inclined surface 10-2_b_, and an angle the inclined surface arranged on the side surface 10-1 and the first surface 10_a_ form may be greater than an angle the first-2 inclined surface 10-2_b_ and the first surface 10_a_ form.

According to some embodiments, each of the first inclined surface 10-2 and the side surface 10-1 may include a plurality of inclined surfaces. In this case, the plurality inclined surfaces may be connected to each other. An angle formed by each of the plurality of inclined surfaces and the first surface 10_a_ may gradually increase and may finally form about 90°.

In this case, an angle formed by each of the plurality of inclined surfaces and the first surface 10_a_ may be an acute angle measured with respect to the first surface 10_a_.

Figure 6A:
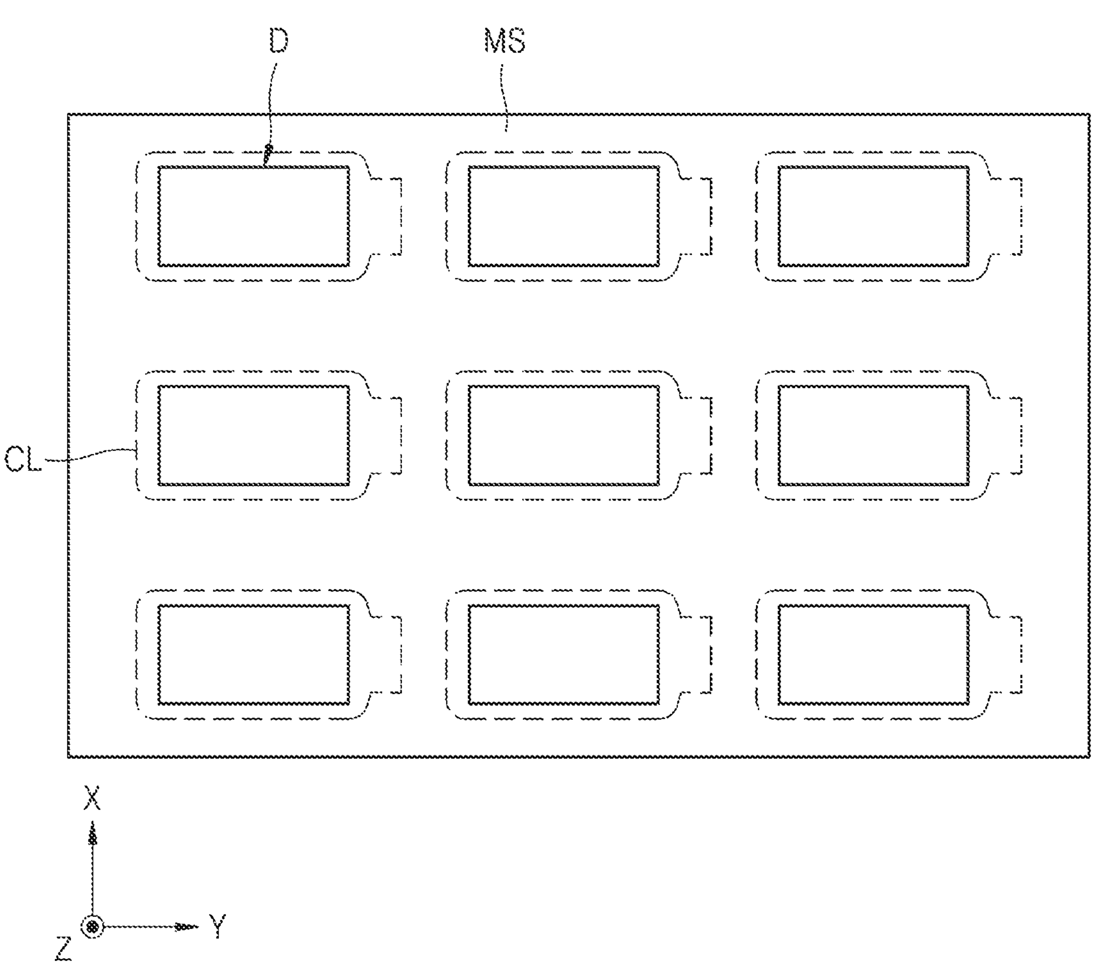
FIG. 6A is a plan view schematically illustrating an operation of manufacturing a display panel shown in FIG. 4 according to some embodiments.

FIG. 6A is a plan view schematically illustrating an operation of manufacturing the display panel shown in FIG. 4. FIGS. 6B to 6E are cross-sectional views schematically illustrating an operation of manufacturing the display panel shown in FIG. 4.

Referring to FIG. 6A, when manufacturing the display panel, the display unit D may be firstly formed on a mother substrate MS (e.g., a base substrate), and then the thin-film encapsulation layer 60_a_ may be formed on the display unit D. At this time, a cutting line (or a cutting surface) CL to be described below may be formed along an outer edge of the display unit D.

Figure 6B:
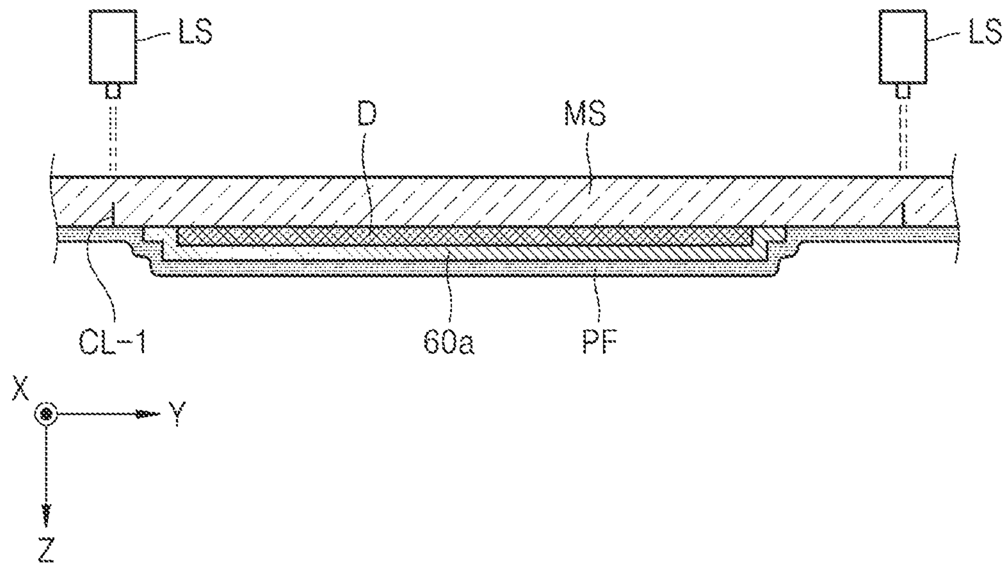
FIGS. 6B to 6E are cross-sectional views schematically illustrating an operation of manufacturing the display panel shown in FIG. 4 according to some embodiments.

Referring to FIG. 6B, a protective film PF may be attached to one surface of the mother substrate MS, on which the display unit D and the thin-film encapsulation layer 60_a_ are formed. At this time, the protective film PF may include a chemical resistant material.

In this case, a laser unit LS may irradiate a laser to the other surface of the mother substrate MS, wherein the protective film PF is not attached to the other surface. At this time, the laser may be in the form of a bessel laser. The laser as described above may form a first cutting line CL-1 on the other surface of the mother substrate MS. At this time, the laser unit LS may form the first cutting line CL-1 while moving to correspond to the cutting line CL shown in FIG. 6A.

In this case, according to some embodiments, the laser unit LS may also irradiate a laser to the mother substrate MS when the protective film PF is not attached.

Figure 6C:
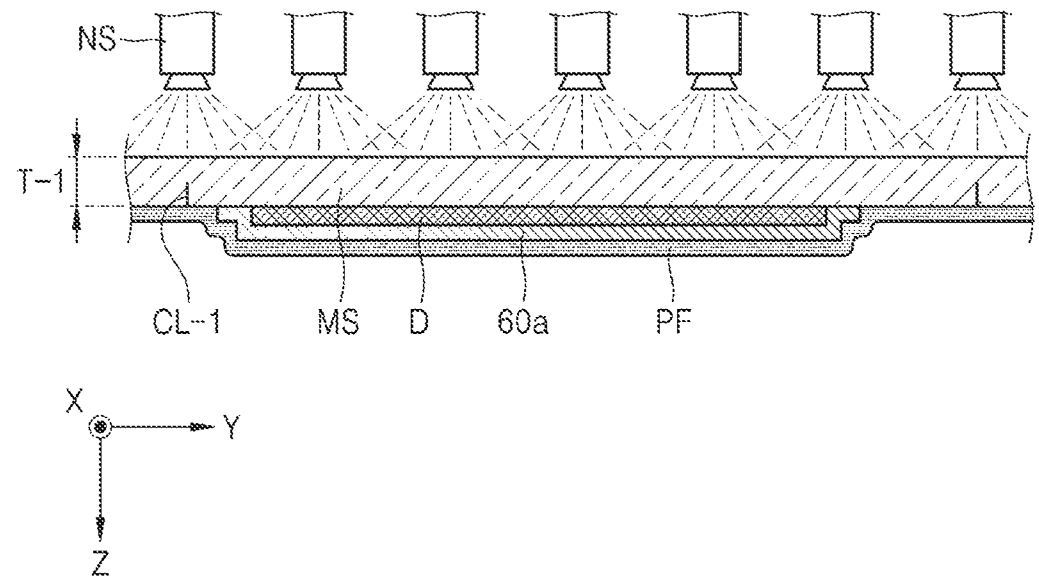

Referring to FIG. 6C, after the first cutting line CL-1 is formed, an etching solution may be sprayed on the other surface of the mother substrate MS through a nozzle NS. At this time, the etching solution may uniformly etch the mother substrate MS in a thickness direction of the mother substrate MS from the other surface of the mother substrate MS.

When the etching solution etches the mother substrate MS, the mother substrate MS may gradually decrease in thickness from an initial thickness T-1. In this case, the protective film PF may prevent the display unit D from being damaged by an etching solution or may prevent a surface of the mother substrate MS, on which the display unit D is located, from being etched.

Figure 6D:
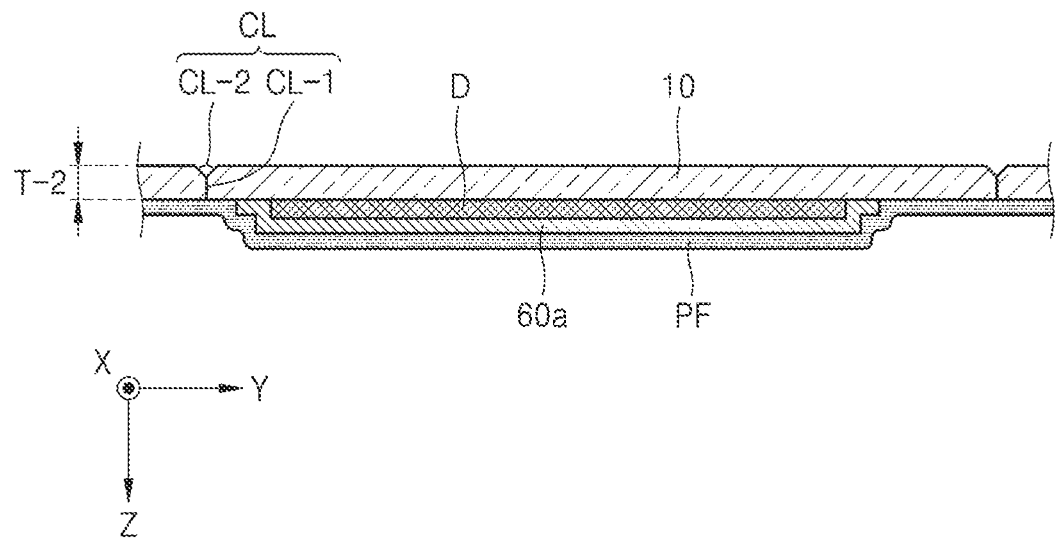

Referring to FIG. 6D, when the mother substrate MS having the initial thickness T-1 is etched by an etching solution and gradually decreases in thickness, and a distance between the first cutting line CL-1 and the other surface of the mother substrate MS reaches a certain range, the etching solution may form a second cutting line CL-2, which meets the first cutting line CL-1, by intensively etching a portion of the first cutting line CL-1. According to some embodiments, when the mother substrate MS is etched by an etching solution and the first cutting line CL-1 meets the other surface of the mother substrate MS, the etching solution may form the second cutting line CL-2 by etching a portion of the first cutting line CL-1 and a portion of the other surface of the mother substrate MS. In addition, the thickness of the mother substrate MS, the thickness being processed by the etching solution, may have a processing thickness T-2 that is less than the initial thickness T-1.

Figure 6E:
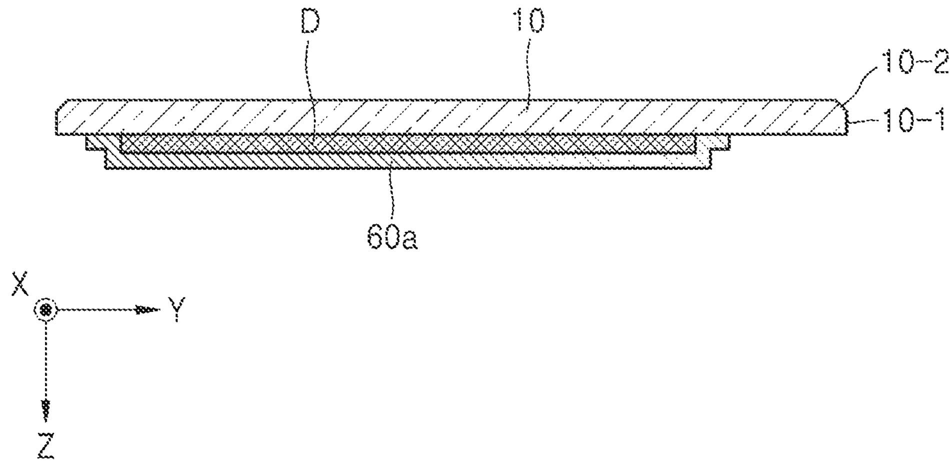

Referring to FIG. 6E, when the second cutting line CL-2 is formed as described above, the second cutting line CL-2 may be connected to the first cutting line CL-1 to form the cutting line CL, and the mother substrate MS may be divided into a plurality of substrates 10. Accordingly, a plurality of display panels may be generated based on the display units D spaced apart from each other.

In addition, in this case, the side surface 10-1 and the first inclined surface 10-2 may be formed on the substrate 10. According to some embodiments, when an etching solution flows between first cutting lines CL-1, as shown in FIG. 5B, the second inclined surface 10-3 may also be formed in addition to the first inclined surface 10-2.

Accordingly, in this case, when the mother substrate MS is divided into a plurality of substrates 10, damage to the substrate 10 of display panel manufactured by not applying a physical force may be prevented. In addition, in the case of the manufactured display panel, as an edge portion of the substrate 10 is formed to be inclined, damage to the substrate 10 may be reduced even when an impact is applied to the edge portion of the substrate 10. In the display device 1, micro-cracks are minimized when the substrate 10 is divided, such that the lifespan of the display device 1 may be increased.

The operation described above is not limited to that shown in FIGS. 6A to 6E, and the operation may also be performed when one surface of the mother substrate MS, on which the display unit D is not located, is arranged to face a lower portion with reference to FIGS. 6A to 6E, and the laser unit LS and the nozzle NS is located below the mother substrate MS.

Figure 7:
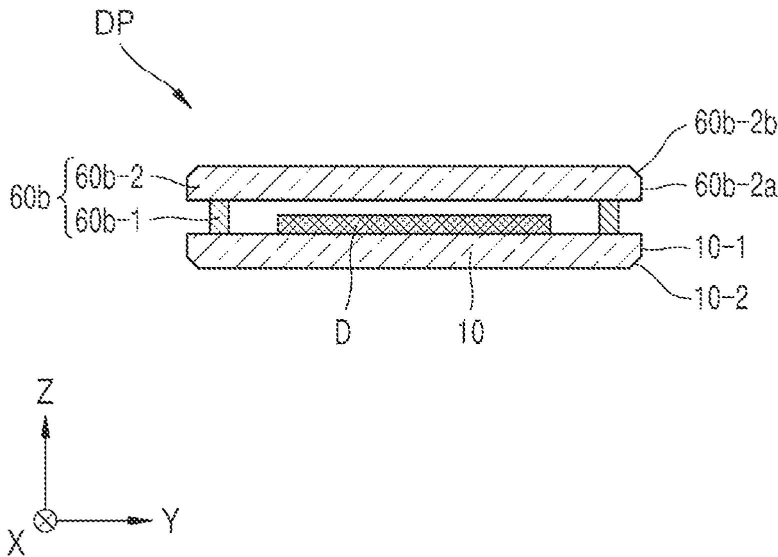
FIG. 7 is a cross-sectional view schematically illustrating a display panel of a display device according to some embodiments.

FIG. 7 is a cross-sectional view schematically illustrating a display panel DP of a display device according to some embodiments.

Referring to FIG. 7, the display panel DP may include the substrate 10, the display unit D, and an encapsulation member 60*b*. At this time, the substrate 10 and the display unit D may be the same as or similar to those described with reference to FIG. 2, and thus, detailed descriptions thereof are omitted.

The encapsulation member 60*b* may include a sealing portion 60*b*-1 and an encapsulation substrate 60*b*-2. The sealing portion 60*b*-1 may be arranged between the substrate 10 and the encapsulation substrate 60*b*-2 to connect the substrate 10 and the encapsulation substrate 60*b*-2 to each other. The encapsulation substrate 60*b*-2 may include the same or similar material as that of the substrate 10, and may be arranged to face the substrate 10. At this time, the sealing portion 60*b*-1 may be coupled to the encapsulation substrate 60*b*-2 and the substrate 10 to block the display unit D from the outside. In this case, the sealing portion 60*b*-1 may be arranged to surround a periphery of the display unit D. For example, the sealing portion 60*b*-1 may be arranged outside the display unit D, similarly to the cutting line CL shown in FIG. 6A. In this case, the sealing portion 60*b*-1 may be arranged between the cutting line CL of FIG. 6A and the outer edge of the display unit D.

At least one of the substrate 10 or the encapsulation substrate 60*b*-2 as described above may be formed to have an inclined edge portion. Hereinafter, for convenience of description, a case in which both the substrate 10 and the encapsulation substrate 60*b*-2 are formed to have inclined edge portions is mainly described in detail.

The substrate 10 may include the side surface 10-1 and the first inclined surface 10-2 arranged between the side surface 10-1 and a first surface. At this time, the first inclined surface 10-2 and the side surface 10-1 may be the same or similar to those described with reference to FIG. 5A, and thus, detailed descriptions thereof are omitted. The encapsulation substrate 60*b*-2 may include a second side surface 60*b*-2*a* and a third inclined surface 60*b*-2*b*. At this time, in this case, a relationship between the second side surface 60*b*-2*a* and the third inclined surface 60*b*-2*b* may be similar to a relationship between the side surface 10-1 and the first inclined surface 10-2 described above.

In this case, in the display panel DP, as inclined surfaces are formed in the encapsulation substrate 60*b*-2 and the substrate 10, damage to the encapsulation substrate 60*b*-2 or the substrate 10 due to an impact applied on an edge of at least one of the encapsulation substrate 60*b*-2 or the substrate 10 may be reduced.

According to some embodiments, a boundary between an inclined surface and a side surface of each of the substrate 10 and the encapsulation substrate 60*b*-2 as described above may be formed to be round, similarly to that shown in FIG. 5C.

FIGS. 8A to 8D are cross-sectional views schematically illustrating an operation of manufacturing the display panel shown in FIG. 7.

Figure 8A:
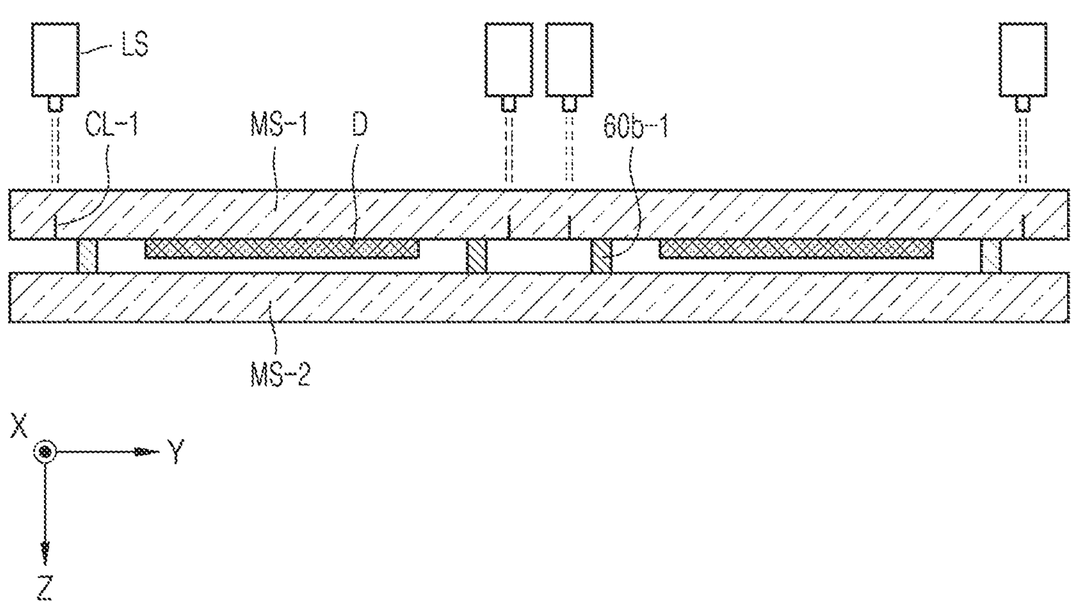
FIGS. 8A to 8E are cross-sectional views schematically illustrating an operation of manufacturing the display panel shown in FIG. 7 according to some embodiments.

Referring to FIG. 8A, when the display panel DP is manufactured, at least two display units D may be formed on a mother substrate MS-1 to be spaced apart from each other. In addition, the sealing portion 60*b*-1 may be located on the mother substrate MS-1. At this time, the sealing portion 60*b*-1 may be arranged to surround the outer edge of the display unit D on a plan view shown in FIG. 6A. Thereafter, an encapsulation mother substrate MS-2 (e.g., encapsulation base substrate) may be arranged to face the mother substrate MS-1, and the encapsulation mother substrate MS-2 may be connected to the sealing portion 60*b*-1. In this case, a sealing material may be provided on the mother substrate MS-1 or the encapsulation mother substrate MS-2 through a nozzle or the like, and after the encapsulation mother substrate MS-2 or the mother substrate MS-1 is located on the sealing portion 60*b*-1, the sealing portion 60*b*-1 is cured by using ultraviolet rays or the like, and thus, the encapsulation mother substrate MS-2 or the mother substrate MS-1 may be fixed to the sealing portion 60*b*-1. According to some embodiments, the sealing portion 60*b*-1 may also be attached to the substrate 10 after being located on the encapsulation mother substrate MS-2 instead of being located on the mother substrate MS-1.

After fixing the mother substrate MS-1 and the encapsulation mother substrate MS-2 to the sealing portion 60*b*-1, a cutting line may be formed on each of the mother substrate MS-1 and the encapsulation mother substrate MS-2. For example, the first cutting line CL-1 may be formed by irradiating a laser on a surface of the mother substrate MS-1 through the laser unit LS. At this time, the first cutting line CL-1 may be arranged to surround the display unit D along a perimeter of the display unit D. In addition, the first cutting line CL-1 may be arranged to be more spaced apart from the display unit D than an area where the sealing portion 60*b*-1 is arranged. That is, the first cutting line CL-1 may be formed to surround an edge of the display unit D to correspond to the cutting line CL shown in FIG. 6A.

Figure 8B:
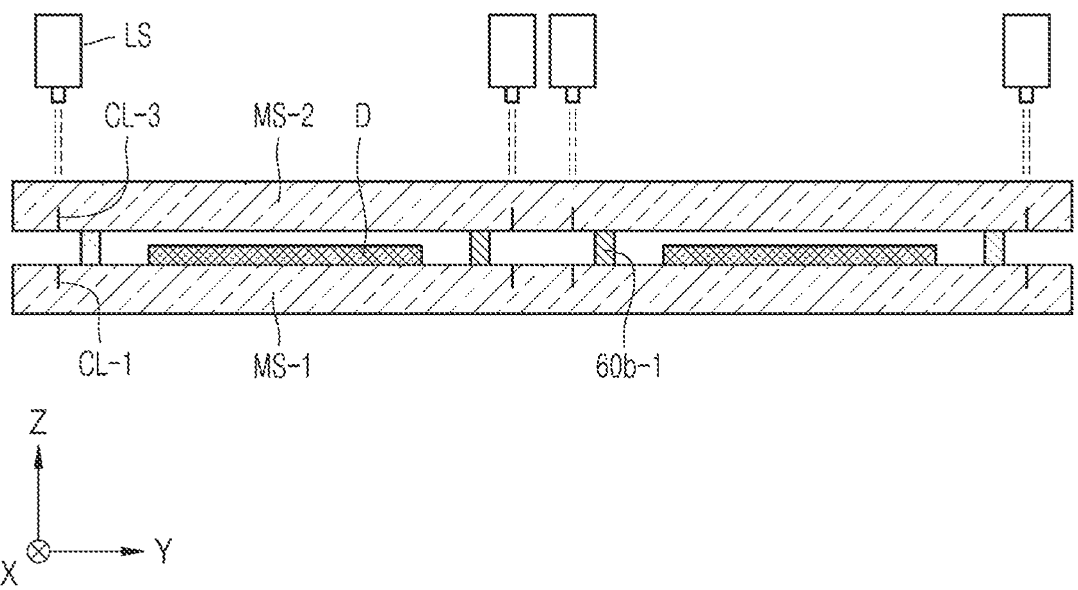

Referring to FIG. 8B, after the first cutting line CL-1 is formed on the mother substrate MS-1, the laser unit LS may be moved to face the encapsulation mother substrate MS-2 or the mother substrate MS-1 and the encapsulation mother substrate MS-2 may be rotated to arrange the encapsulation mother substrate MS-2 such that the encapsulation mother substrate MS-2 faces the laser unit LS.

A laser irradiated from the laser unit LS may form a third cutting line CL-3 on the encapsulation mother substrate MS-2.

Figure 8C:
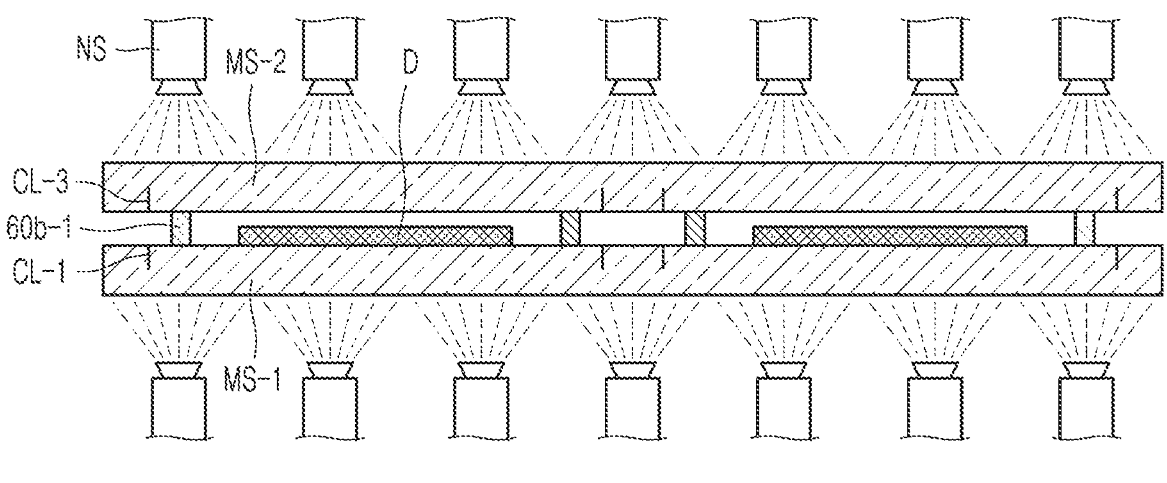
Figure 8C:
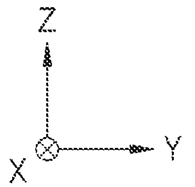

Referring to FIG. 8C, an etching solution may be sprayed on the mother substrate MS-1 on which the first cutting line CL-1 is formed and the encapsulation mother substrate MS-2 on which the third cutting line CL-3 is formed through the nozzle NS. At this time, a method of spraying the etching solution may be varied. For example, according to some embodiments, as shown in FIG. 8C, the nozzle NS may be arranged to face each of the mother substrate MS-1 and the encapsulation mother substrate MS-2, such that the etching solution may be sprayed on each of the mother substrate MS-1 and the encapsulation mother substrate MS-2. According to some embodiments, the nozzle NS may be arranged to face one of the mother substrate MS-1 and the encapsulation mother substrate MS-2, such that the etching solution may be sprayed on one of the mother substrate MS-1 and the encapsulation mother substrate MS-2. Thereafter, as the nozzle NS is moved or the mother substrate MS-1 and the encapsulation mother substrate MS-2 are rotated, the nozzle NS and the other one of the mother substrate MS-1 and the encapsulation mother substrate MS-2 are arranged to face each other, then the nozzle NS may also spray the etching solution on the other one of the mother substrate MS-1 and the encapsulation mother substrate MS-2. According to some embodiments, when the nozzle NS is arranged to face one of the mother substrate MS-1 and the encapsulation mother substrate MS-2, the protective film PF shown in FIG. 6C may be arranged on the other one of the mother substrate MS-1 and the encapsulation mother substrate MS-2, and the nozzle NS may also spray an etching solution on one of the mother substrate MS-1 and the encapsulation mother substrate MS-2. After removing the protective film PF, the nozzle NS may be arranged to face the other one of the mother substrate MS-1 and the encapsulation mother substrate MS-2, and the nozzle NS may also spray the etching solution on the other one of the mother substrate MS-1 and the encapsulation mother substrate MS-2.

Figure 8D:
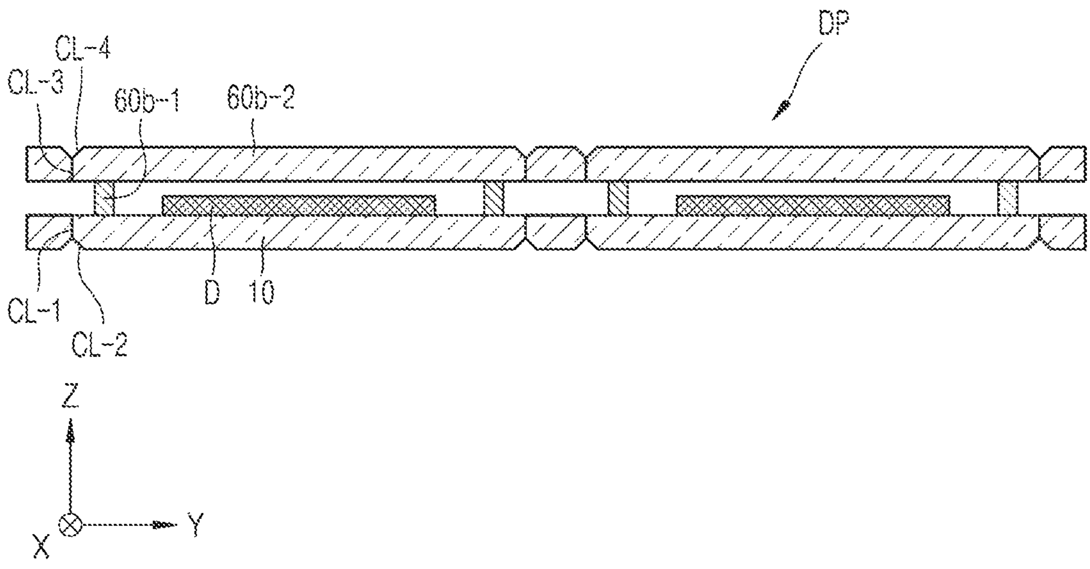

Referring FIG. 8D, when the etching solution is sprayed on each of the mother substrate MS-1 and the encapsulation mother substrate MS-2, the first cutting line CL-1 may be connected to the second cutting line CL-2, similarly to that shown in FIG. 6D. In addition, the third cutting line CL-3 may be connected to a fourth cutting line CL-4 extending to a surface of the encapsulation mother substrate MS-2. At this time, a thickness of each of the mother substrate MS-1 and the encapsulation mother substrate MS-2 may be less than an initial thickness. A method of connecting the first cutting line CL-1 to the second cutting line CL-2 may be performed similarly to that described with reference to FIG. 6D. In addition, a method of connecting the third cutting line CL-3 to the fourth cutting line CL-4 may be similar to the method of connecting the first cutting line CL-1 to the second cutting line CL-2.

Figure 8E:
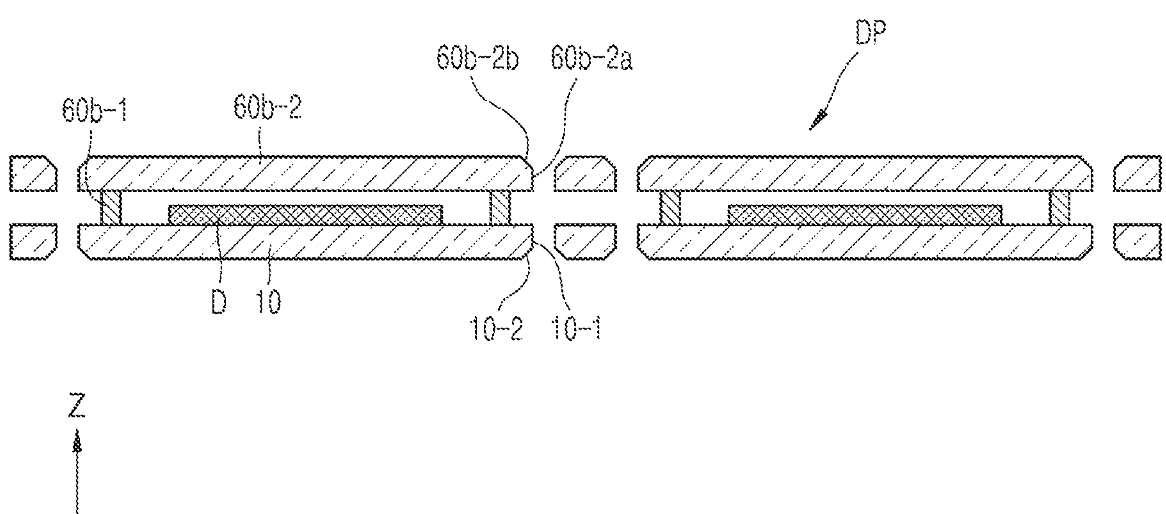

Referring to FIG. 8E, as described above, when the first cutting line CL-1 is connected to the second cutting line CL-2, and the third cutting line CL-3 is connected to the fourth cutting line CL-4, the mother substrate MS-1 and the encapsulation mother substrate MS-2 may each be divided into a plurality based on the display unit D. At this time, one display unit D may be surrounded by the substrate 10, the sealing portion 60*b*-1, and the encapsulation substrate 60*b*-2 to be disconnected from the outside.

In this case, the substrate 10 may have the side surface 10-1 and the first inclined surface 10-2, and the encapsulation substrate 60*b*-2 may have the second side surface 60*b*-2*a* and the third inclined surface 60*b*-2*b*. According to some embodiments, the substrate 10 may further include a second inclined surface, or the encapsulation substrate 60*b*-2 may further include a fourth inclined surface.

Accordingly, a method of manufacturing a display device may reduce or prevent damage to at least one of the substrate 10 or the encapsulation substrate 60*b*-2 when the display panel is manufactured. In addition, the method of manufacturing the display device may shorten the manufacturing time of a display panel and simplify an operation of manufacturing a display panel.

In the display panel, at least one edge portion of the substrate 10 and the encapsulation substrate 60*b*-2 is formed to be inclined, and thus, damage to the substrate 10 and the encapsulation substrate 60*b*-2 may be reduced. In addition, the lifespan of the display panel may be increased by reducing damage to the substrate 10 and the encapsulation substrate 60*b*-2.

The operation described above is not limited thereto, and the operation may be performed by forming the first cutting line CL-1 on the mother substrate MS-1 after the third cutting line CL-3 is formed on the encapsulation mother substrate MS-2.

Figure 9:
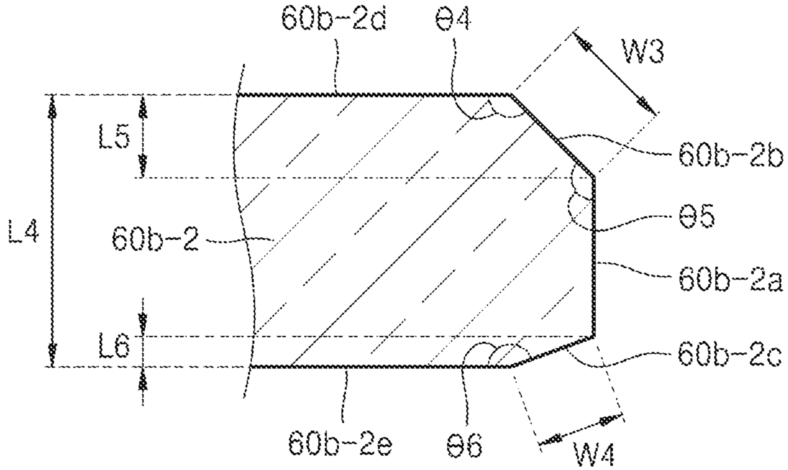
FIG. 9 is a cross-sectional view schematically illustrating a display panel of a display device according to some embodiments.
Figure 9:
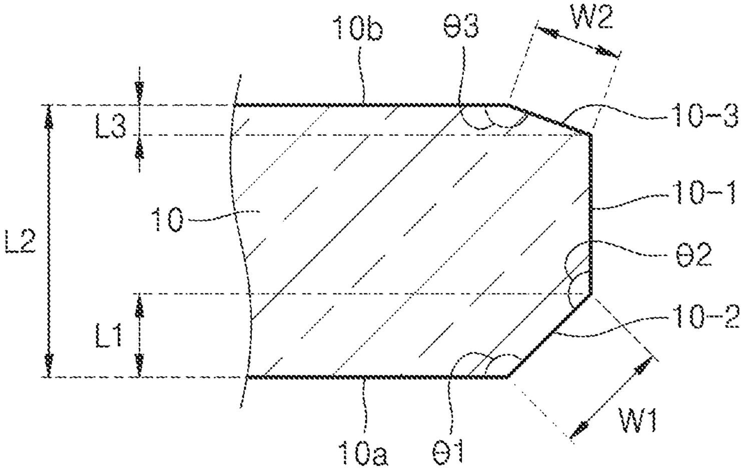
Figure 9:
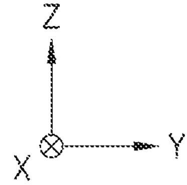

FIG. 9 is a cross-sectional view schematically illustrating a display panel of a display device according to some embodiments.

Referring to FIG. 9, a display panel may include the substrate 10, a display unit, and an encapsulation member. At this time, the substrate 10 and the display unit may be the same as or similar to those described with reference to FIG. 2, and thus, detailed descriptions thereof are omitted.

The encapsulation member may include a sealing portion and the encapsulation substrate 60*b*-2. At this time, the sealing portion may be the same as or similar to that described with reference to FIG. 7. In addition, the encapsulation substrate 60*b*-2 may be similar to that described with reference to FIG. 7.

The substrate 10 may include the side surface 10-1, the first inclined surface 10-2 between the side surface 10-1 and the first surface 10*a*, and the second inclined surface 10-3 between the second surface 10*b* and the side surface 10-1. At this time, in this case, a first angle 81, a second angle 82, and a third angle 83 formed on the substrate 10 may be the same as or similar to those described with reference to FIG. 5B. In addition, a relationship between a first length W1 and a second length W2, and a relationship between a first thickness L1, a second thickness L2, and a third thickness L3 may be the same as or similar to those described with reference to FIG. 5B.

Similarly to the substrate 10, the encapsulation substrate 60*b*-2 may include a first encapsulation substrate surface 60*b*-2*d*, the second side surface 60*b*-2*a*, the third inclined surface 60*b*-2*b*, a fourth inclined surface 60*b*-2*c*, and a second encapsulation substrate surface 60*b*-2*e*. In this case, the encapsulation substrate 60*b*-2 may include a fourth angle 84, a fifth angle 85, and a sixth angle 86, which are respectively similar to the first angle 81, the second angle 82, and the third angle 83 of the substrate 10. That is, a sum of the fourth angle 84, the fifth angle 85, and the sixth angle 86 may be less than 450 degrees. In addition, a third length W3 of the third inclined surface 60*b*-2*b* may be different from a fourth length W4 of the fourth inclined surface 60*b*-2*c*. For example the third length W3 may be greater than the fourth length W4. A relationship between a fourth thickness L4 that is a total thickness of the encapsulation substrate 60*b*-2, a fifth thickness L5 from the first encapsulation substrate surface 60*b*-2*d* to a boundary of the third inclined surface 60*b*-2*b*, and a sixth thickness L6 from the second encapsulation substrate surface 60*b*-2*e* to a boundary of the fourth inclined surface 60*b*-2*c* may be similar to the relationship between the first thickness L1, the second thickness L2, and the third thickness L3 described above. The fourth angle 84 may mean an angle between the first encapsulation substrate surface 60*b*-2*d* and the third inclined surface 60*b*-2*b*, the fifth angle 85 may mean an angle between the third inclined surface 60*b*-2*b* and the second side surface 60*b*-2*a*, and the sixth angle 86 may mean an angle between the second encapsulation substrate surface 60*b*-2*e* and the fourth inclined surface 60*b*-2*c*.

In this case, the relationship between the second side surface 60*b*-2*a* and the third inclined surface 60*b*-2*b* may be similar to the relationship between the side surface 10-1 and the first inclined surface 10-2 described with reference to FIG. 5B. In addition, a relationship between the second side surface 60*b*-2*a* and the fourth inclined surface 60*b*-2*c* may be similar to the relationship between the side surface 10-1 and the second inclined surface 10-3 described with reference to FIG. 5B.

In this case, the fourth inclined surface 60*b*-2*c* and the second inclined surface 10-3 may be arranged to face each other. In addition, the first inclined surface 10-2 and the third inclined surface 60*b*-2*b* may be arranged on an outer edge of the display device 1.

In this case, in the display panel, as inclined surfaces are formed in the encapsulation substrate 60*b*-2 and the substrate 10, damage to the encapsulation substrate 60*b*-2 or the substrate 10 due to an impact applied on an edge of at least one of the encapsulation substrate 60*b*-2 or the substrate 10 may be reduced.

In this case, according to some embodiments, at least one of a point where the first surface 10*a* and the first inclined surface 10-2 are connected to each other, a point where the first inclined surface 10-2 and the side surface 10-1 are connected to each other, a point where the side surface 10-1 and the second inclined surface 10-3 are connected to each other, or a point where the second inclined surface 10-3 and the second surface 10*b* are connected to each other may be formed to be round, or at least one of the first inclined surface 10-2 or the side surface 10-1 may include a plurality of inclined surfaces. In addition, at least one of a point where the first encapsulation substrate surface 60*b*-2*d* and the third inclined surface 60*b*-2*b* are connected to each other, a point where the third inclined surface 60*b*-2*b* and the second side surface 60*b*-2*a* are connected to each other, a point where the second side surface 60*b*-2*a* and the fourth inclined surface 60*b*-2*c* are connected to each other, or a point where the fourth inclined surface 60*b*-2*c* and the second encapsulation substrate surface 60*b*-2*e* are formed to be round, or at least one of the third inclined surface 60*b*-2*b* or the second side surface 60*b*-2*a* may include a plurality of inclined surfaces.

FIGS. 10A to 10D are cross-sectional views illustrating an operation of manufacturing the display panel shown in FIG. 4.

Figure 10A:
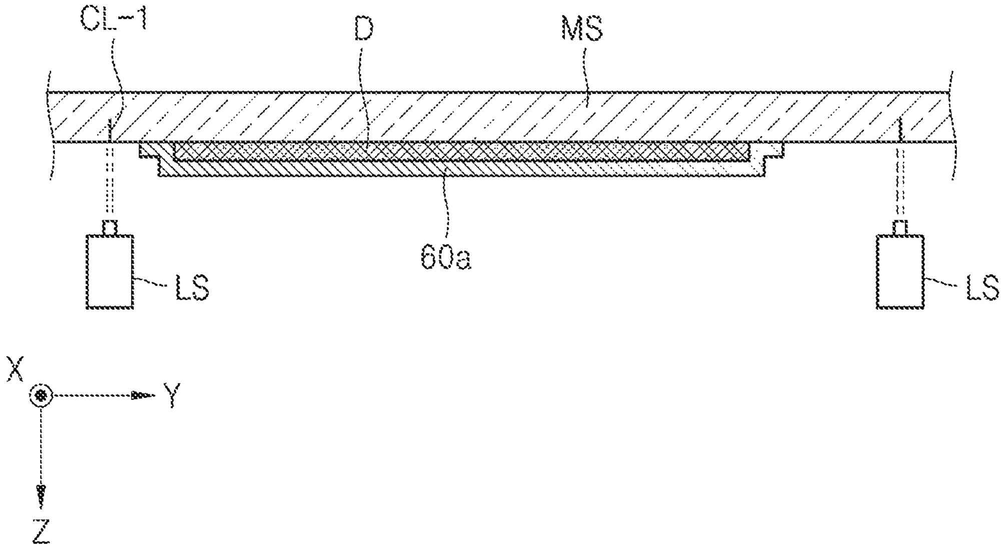
FIGS. 10A to 10D are cross-sectional views illustrating an operation of manufacturing the display panel shown in FIG. 4 according to some embodiments.

Referring to FIG. 10A, the laser unit LS may be arranged to face a surface of the mother substrate MS to irradiate a laser on the surface of the mother substrate MS-1. In this case, the laser unit LS may form the first cutting line CL-1 on the surface of the mother substrate MS. At this time, the surface of the mother substrate MS may be a surface on which the display unit D is located. In this case, the laser unit LS is illustrated as being located below the mother substrate MS with respect to FIG. 10A, but is not limited thereto. The laser unit LS may be located on the mother substrate MS with respect to FIG. 10A to irradiate a laser on a surface of the mother substrate MS. In this case, the display unit D may be arranged to face an upper portion with respect to FIG. 10A. However, hereinafter, for convenience of description, a case where the laser unit LS is arranged as shown in FIG. 10A is mainly described in detail.

Figure 10B:
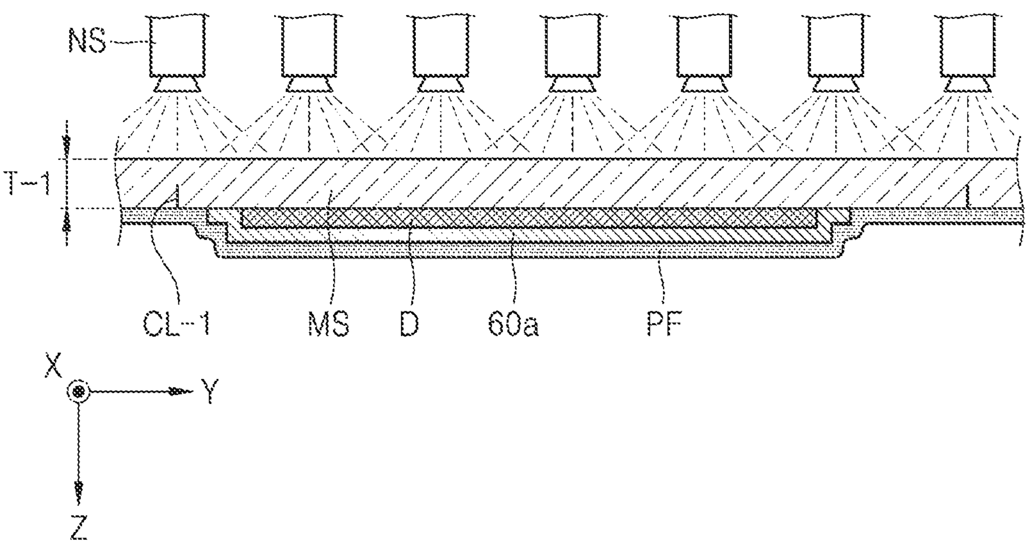

Referring to FIG. 10B, after a laser is irradiated, the protective film PF may be arranged to cover the first cutting line CL-1. Thereafter, an etching solution may be sprayed on the other surface of the mother substrate MS through the nozzle NS. The etching solution may etch the other surface of the mother substrate MS, and when the other surface of the mother substrate MS is etched by a certain distance or more, the second cutting line CL-2 may be formed in a portion of the mother substrate MS, the portion corresponding to the first cutting line CL-1. In this case, the nozzle NS is illustrated as being located above the mother substrate MS with respect to FIG. 10B, but is not limited thereto. The nozzle NS may be located below the mother substrate MS instead of above the mother substrate MS as shown in FIG. 10B. At this time, the other surface of the mother substrate MS, on which the display unit D is not located, may be arranged to face a lower portion with respect to FIG. 10B.

Figure 10C:
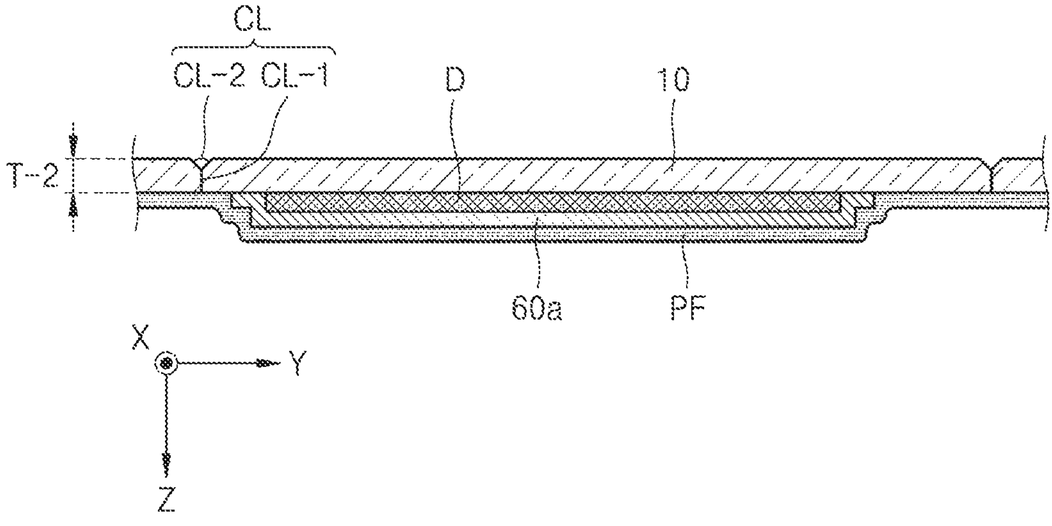

Referring to FIG. 10C, the second cutting line CL-2 may be connected to the first cutting line CL-1 to form the cutting line CL. At this time, the thickness T-2 of the mother substrate MS may be less than an initial thickness T-1 (FIG. 10B), and the mother substrate MS may be divided between the display units D spaced apart from each other. In addition, a portion of the mother substrate MS adjacent to the display unit D arranged on the outermost side of the mother substrate MS may be removed.

Figure 10D:
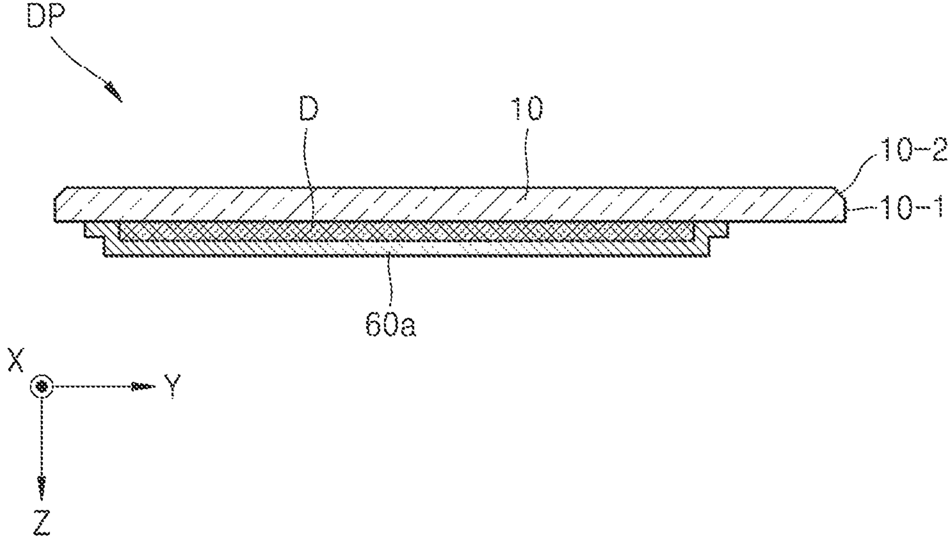

Referring to FIG. 10D, as described above, the mother substrates MS, wherein the display unit D is located on each of the substrates 10, may be separated from each other to form one display panel DP. In this case, the substrate 10 of the display panel DP may include the side surface 10-1 and the first inclined surface 10-2, or may include the side surface 10-1, the first inclined surface 10-2, and the second inclined surface 10-3.

According to some embodiments, the substrate 10 may include an inclined surface having the same or similar shape as that described with reference to FIGS. 5B and 5C.

FIGS. 11A to 11D are cross-sectional views illustrating an operation of manufacturing the display panel shown in FIG. 7.

Figure 11A:
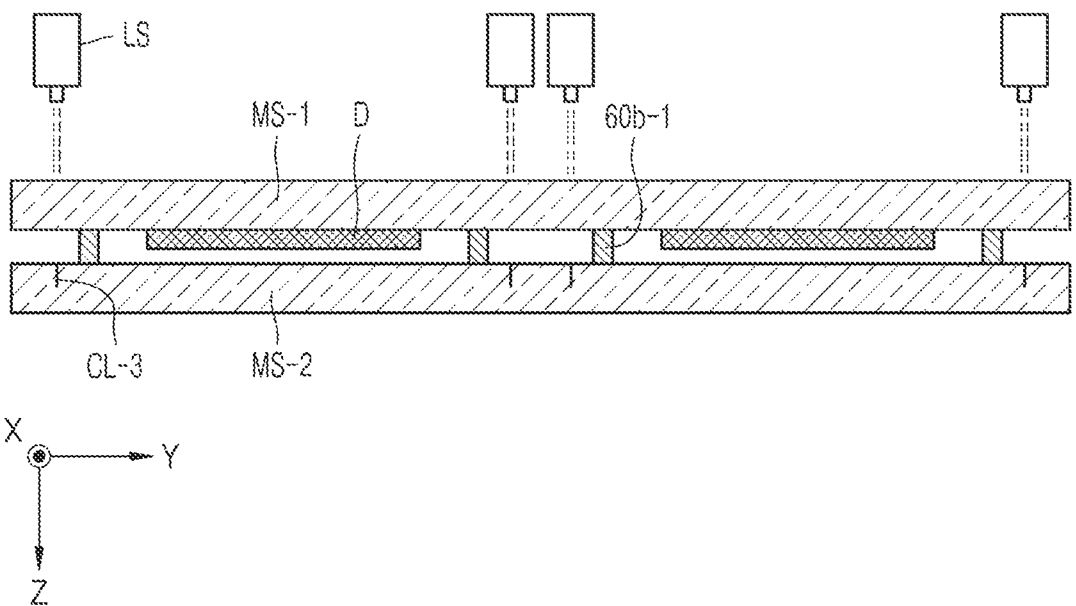
FIGS. 11A to 11D are cross-sectional views illustrating an operation of manufacturing the display panel shown in FIG. 7 according to some embodiments.
Figure 11B:
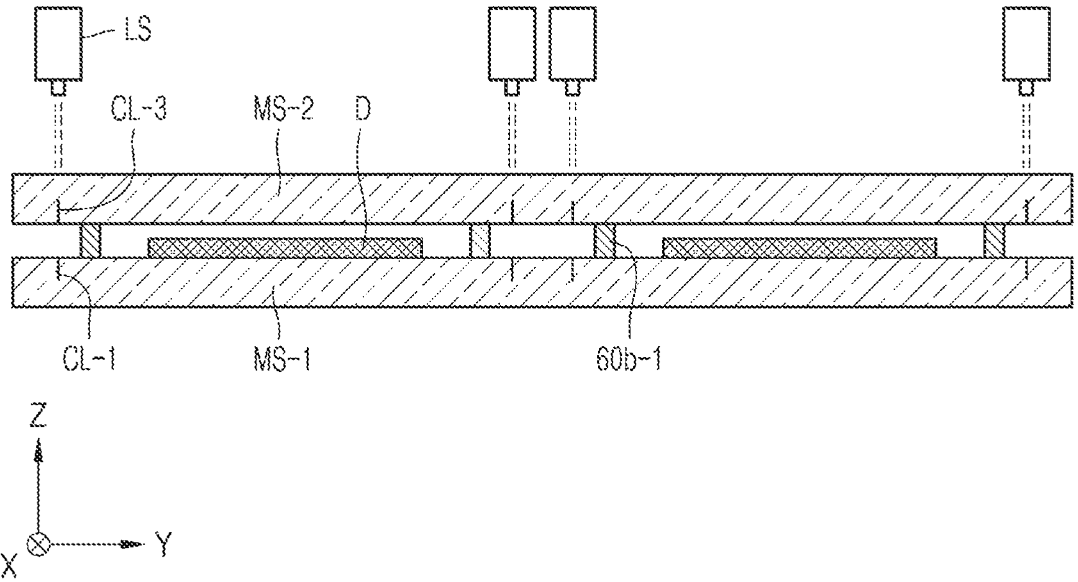

Referring to FIG. 11A, after the mother substrate MS-1 and the encapsulation mother substrate MS-2 are coupled to the sealing portion 60*b*-1, the third cutting line CL-3 may be formed on the encapsulation mother substrate MS-2 by the laser unit LS. In this case, the laser unit LS may be located above the mother substrate MS-1. According to some embodiments, the laser unit LS may be located at a lower portion with respect to FIG. 11A, and the laser unit LS may also be arranged to face the mother substrate MS-1.

Referring to FIG. 11. B, after the third cutting line CL-3 is formed, the mother substrate MS-1 and the encapsulation mother substrate MS-2 are inverted such that the laser unit LS is arranged to face the encapsulation mother substrate MS-2, then the first cutting line CL-1 may be formed on the mother substrate MS-1.

Figure 11C:
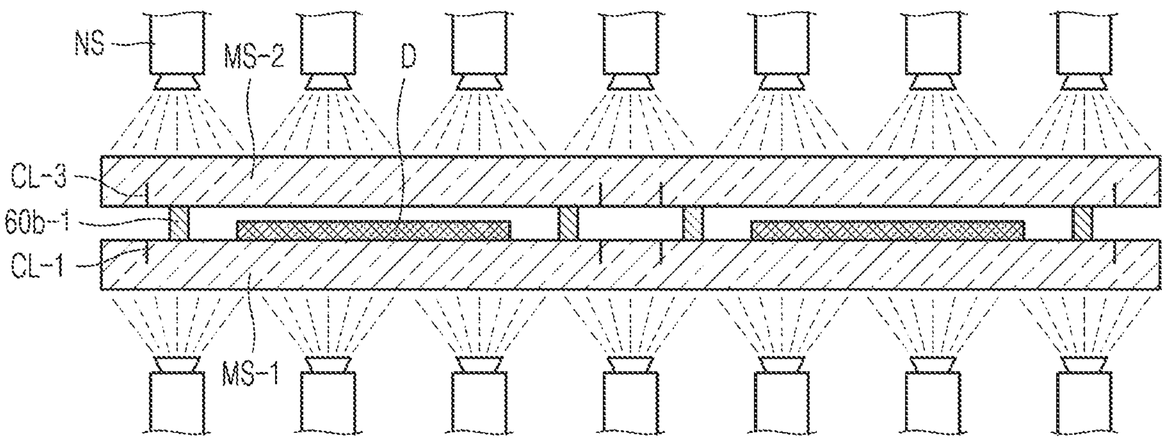
Figure 11C:
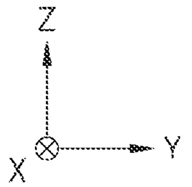

Referring to FIG. 11C, after the first cutting line CL-1 and the third cutting line CL-3 are respectively formed on the mother substrate MS-1 and the encapsulation mother substrate MS-2, an etching solution may be sprayed on a surface of the mother substrate MS-1 and a surface of the encapsulation mother substrate MS-2 through the nozzle NS.

In this case, the etching solution may be simultaneously supplied to the mother substrate MS-1 and the encapsulation mother substrate MS-2, or may be supplied to one of the mother substrate MS-1 and the encapsulation mother substrate MS-2 and then supplied to the other one of the mother substrate MS-1 and the encapsulation mother substrate MS-2.

Figure 11D:
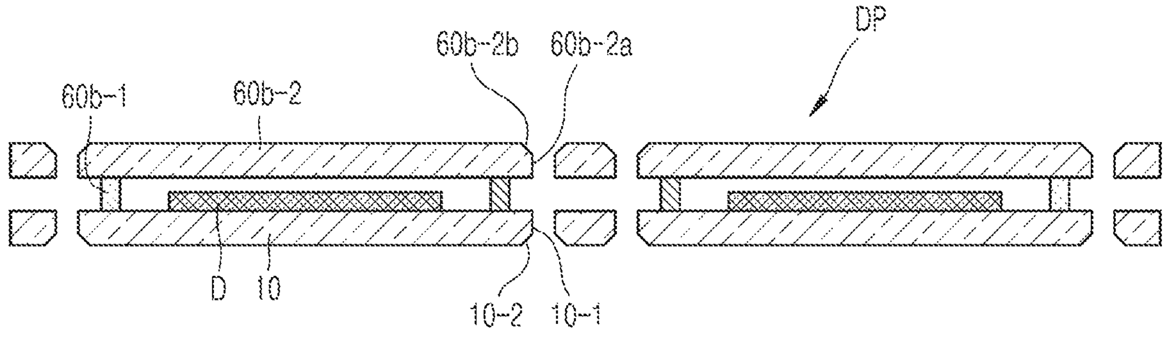
Figure 11D:
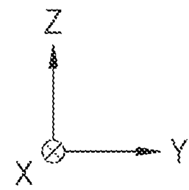

Referring to FIG. 11D, when the etching solution is supplied as described above, the first cutting line CL-1 and the third cutting line CL-3 are connected to other cutting lines as described with reference to FIG. 8D, and thus, the mother substrate MS-1 and the encapsulation mother substrate MS-2 may be separated from each other, and a plurality of display panels DP each including the substrate 10, the encapsulation substrate 60*b*-2, the display unit D, and the sealing portion 60*b*-1 may be separated.

According to some embodiments, the substrate 10 and the encapsulation substrate 60*b*-2 may each include an inclined surface having the same or similar shape as that described with reference to FIGS. 7 and 9.

Figure 12:
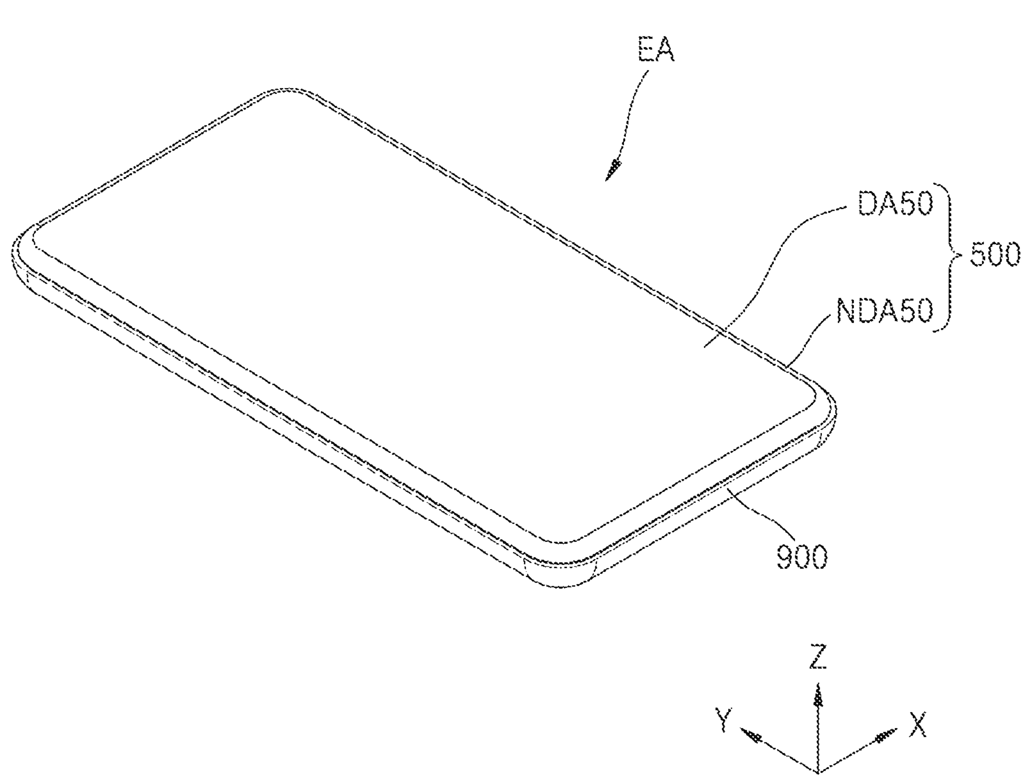
FIG. 12 is a schematic perspective view of an electronic device according to some embodiments.
Figure 13:
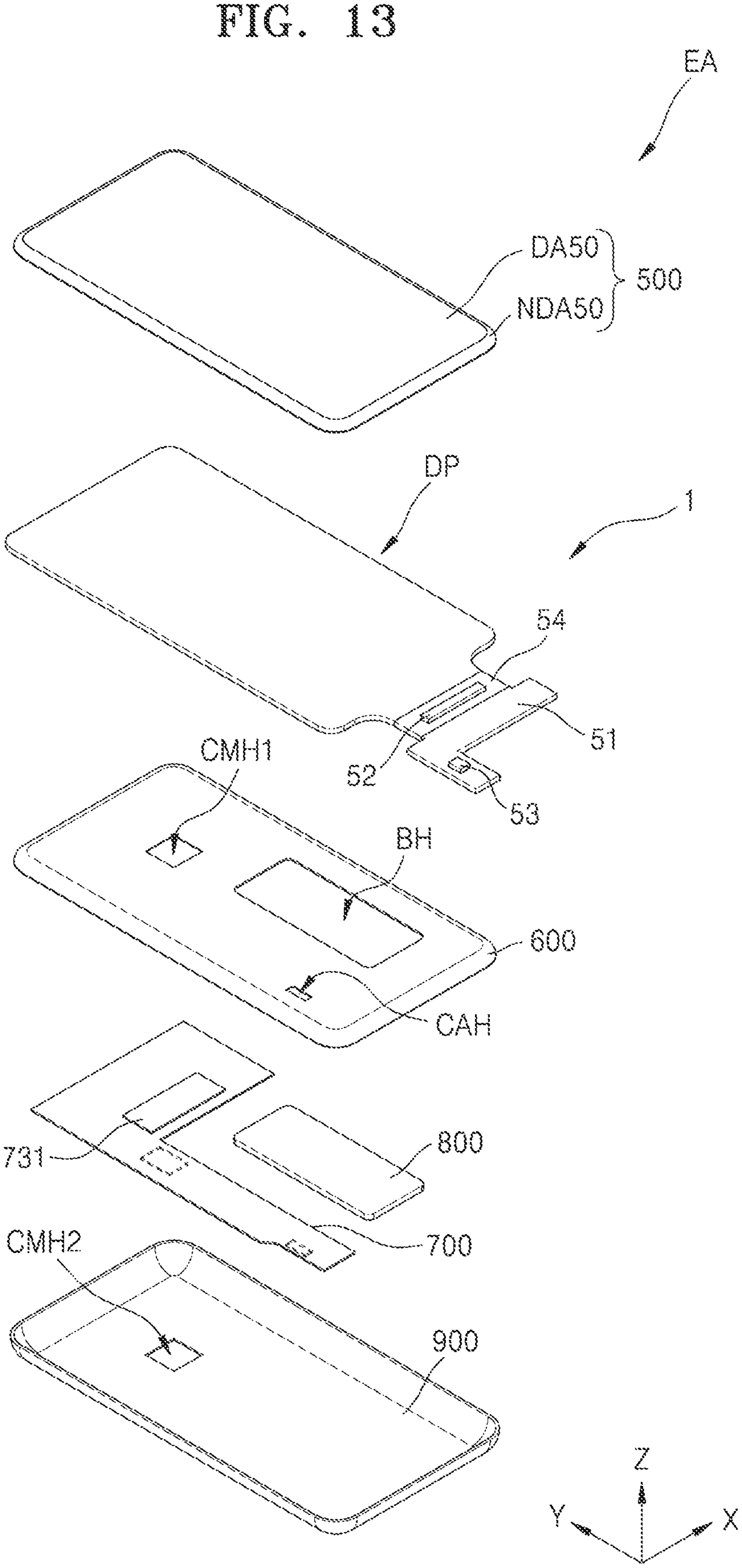
FIG. 13 is an exploded perspective view schematically illustrating the electronic device shown in FIG. 12 according to some embodiments.
Figure 14:
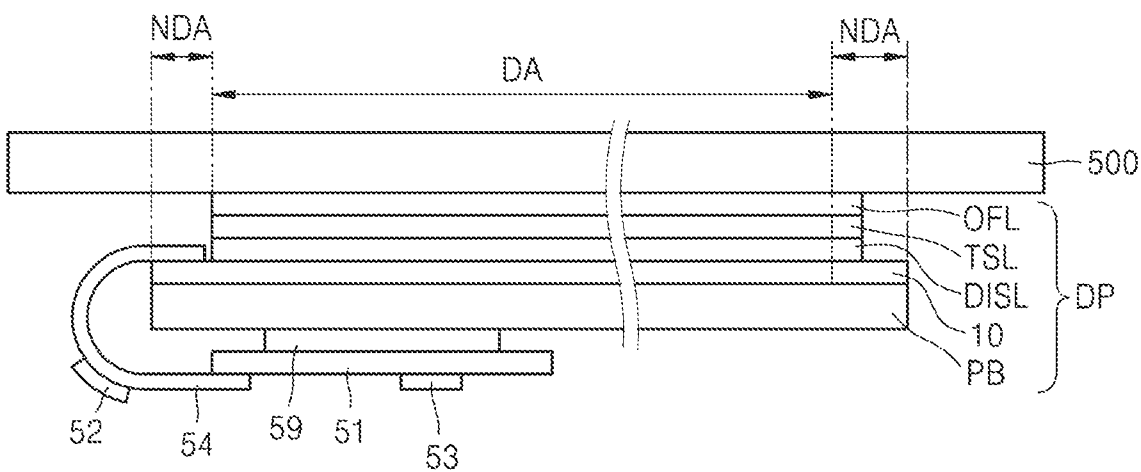
FIG. 14 is a cross-sectional view schematically illustrating a portion of the electronic device shown in FIG. 12 according to some embodiments.
Figure 14:
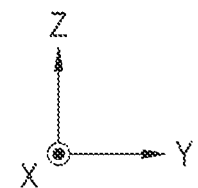

FIG. 12 is a schematic perspective view of an electronic device EA according to some embodiments. FIG. 13 is an exploded perspective view schematically illustrating the electronic device EA shown in FIG. 12. FIG. 14 is a cross-sectional view schematically illustrating a portion of the electronic device EA shown in FIG. 12.

Referring to FIGS. 12 to 14, the electronic device EA is a device which displays a video or a still image, which may be a portable electronic device, such as a mobile phone, a smart phone, a table personal computer (PC), a mobile communication terminal, an electronic notebook, an electronic book, a portable multimedia player (PMP), a navigation device, an Ultra Mobile PC (UMPC), or the like, and may also include an electronic device used as a display screen of various products, such as a television, a laptop computer, a monitor, an advertisement board, the Internet of things (IoT), or the like. In addition, the electronic device EA may be used as a wearable device, such as a smart watch, a watch phone, a glasses-type display, and a head-mounted display (HMD). In addition, the electronic device EA may be used as a dashboard of a vehicle, a center fascia of a vehicle or a center information display (CID) located on a dashboard, a room mirror display replacing a side mirror of a vehicle, and a display arranged on a back surface of a front seat as entertainment for a back seat of a vehicle. Hereinafter, a case in which the electronic device EA is a smart phone is mainly described in detail.

The electronic device EA may include a cover window 500, the display device 1, a bracket 600, a main circuit board 700, a battery 800, and a lower cover 900.

In the present disclosure, "upper portion" refers to a direction in which the cover window 500 is arranged with respect to the display panel DP, that is, a +z direction, and "lower portion" refers to a direction in which the lower cover 900 is arranged with respect to the display panel DP, that is, a −z direction. In addition, "left", "right", "above", and "below" indicate directions when the display panel DP is viewed from a plan view. For example, "left" indicates a −x direction, "right" indicates a +x direction, "above" indicates a +y direction, and "below" indicates a −y direction.

The electronic device EA may have a rectangular shape in a plan view. For example, the electronic device EA may have a rectangular planar shape having a short side in a first direction (x direction) and a long side in a second direction (y direction), as shown in FIG. 1. An edge where the short side in the first direction (x direction) and the long side in the second direction (y direction) meet may be round to have a certain curvature or may be formed at a right angle. The planar shape of the electronic device EA is not limited to a rectangular shape, and may be formed in other polygonal, elliptical, or irregular shapes.

The cover window 500 may be located on the display panel DP of the display device 1 to cover the upper surface of the display panel DP. Accordingly, the cover window 500 may function to protect the upper surface of the display panel DP.

The cover window 500 may include a transparent cover portion DA50 corresponding to the display panel DP and a light-blocking cover portion NDA50 corresponding to an area other than the display panel DP. The light-blocking cover portion NDA50 may include an opaque material that blocks light. The light-blocking cover portion NDA50 may include a pattern that may be shown to a user when an image is not displayed.

The display panel DP may be located below the cover window 500. The display panel DP may overlap the transparent cover portion DA50 of the cover window 500.

The display panel DP may include a display area as shown in FIG. 1. The display area may be an area in which an image is displayed. According to some embodiments, the display panel DP may include a main display area and a component area. Both the main display area and the component area are areas in which images are displayed, and the component area may be an area in which a component, such as a sensor and a camera using visible light, infrared light, or sound are located therebelow. According to some embodiments, the component area may be an area having greater light transmittance and/or sound transmittance than that of the main display area. According to some embodiments, when light is transmitted through the component area, light transmittance may be about 25% or more or 30% or more, more preferably 50% or more, 75% or more, 80% or more, 85% or more, or 90% or more.

The display panel DP may be a transparent display panel that is implemented to be transparent, so that an object or a background on the lower surface of the display panel DP may be viewed from the upper surface of the display panel DP. Alternatively, the display panel DP may be a reflective display panel, which may reflect an object or a background on the upper surface of the display panel DP.

The flexible film 54 may be attached to the edge on a side of the display panel DP. In addition, the display driving unit 52 may be located on the flexible film 54.

The display circuit board 51 may be attached to the other side of the flexible film 54. The touch sensor driving unit 53 may be located on the display circuit board 51.

A touch screen layer of the display panel DP may sense a user's touch input by using at least one of various touch methods, such as a resistive film method, a capacitive method, or the like. For example, when the touch screen layer of the display panel DP senses a user's touch input by using the capacitive method, the touch sensor driving unit 53 may determine whether the user touches by applying driving signals to driving electrodes among the touch electrodes and sensing voltages charged in mutual capacitances (hereinafter, referred to as "mutual capacities") between the driving electrodes and sensing electrodes through the sensing electrodes among the touch electrodes. The user's touch may include a contact touch and a proximity touch. The contact touch refers to a touch in which an object, such as a user's finger, a pen, or the like, directly contacts the cover window 500 located on the touch screen layer. The proximity touch refers to a touch in which an object such as a user's finger, a pen, or the like is positioned proximately on the cover window 500, such as hovering.

A power supply unit configured to supply driving voltages for driving pixels of the display panel DP, a scan driving unit, and the display driving unit 52 may be located above the display circuit board 51. Alternatively, the power supply unit may be integrated with the display driving unit 52, and in this case, the display driving unit 52 and the power supply unit may be formed as one IC.

The bracket 600 for supporting the display panel DP may be located below the display panel DP. The bracket 600 may include plastic, metal, or both plastic and metal. A first camera hole CMH1 into which a camera device 731 is inserted, a battery hole BH in which the battery 800 is arranged, and a cable hole CAH through which a cable connected to the display circuit board 51 passes may be formed in the bracket 600. In addition, a component hole overlapping a partial area of the display panel DP may be further provided in the bracket 600. In this case, the component hole may overlap components of the main circuit board 700 in a third direction (z direction). Accordingly, an area on the display panel DP may overlap the components of the main circuit board 700 in the third direction (z direction).

A plurality of components of the main circuit board 700 may be provided. For example, each of the plurality of components may be provided as a proximity sensor, an illuminance sensor, an iris sensor, and a camera (or image sensor). In this case, an area of the display panel DP, the area corresponding to each component, may have a certain light transmittance. The proximity sensor using infrared light may detect an object arranged close to an upper surface of the electronic device EA, and the illuminance sensor may detect the brightness of light incident on the upper surface of the electronic device EA. In addition, the iris sensor may capture an image of an iris of a person on the upper surface of the electronic device EA, and the camera may capture an image of an object on the upper surface of the electronic device EA. The component as described above may not be limited to a proximity sensor, an illuminance sensor, an iris sensor, and a camera.

The main circuit board 700 and the battery 800 may be located below the bracket 600. The main circuit board 700 may be a printed circuit board or a flexible printed circuit board.

The battery 800 may be arranged not to overlap the main circuit board 700 in the third direction (z direction). The battery 800 may overlap the battery hole BH of the bracket 600.

The lower cover 900 may be located below the main circuit board 700 and the battery 800. The lower cover 900 may be fastened and fixed to the bracket 600. The lower cover 900 may form an exterior of a lower surface of the electronic device EA. The lower cover 900 may include plastic, metal, or both plastic and metal.

A second camera hole CMH2 exposing a lower surface of the camera device 731 may be formed in the lower cover 900. A position of the camera device 731 and positions of the first and second camera holes CMH1 and CMH2 corresponding to the camera device 731 are not limited to the embodiments shown in FIG. 13.

The display panel DP may include the substrate 10, a display layer DISL including a display unit, a touch screen layer TSL, an optical functional layer OFL, and a panel protective member PB.

The display layer DISL including a display unit may be located on the substrate 10. The display layer DISL may be a layer including pixels and displaying an image. The display layer DISL may include a circuit layer having thin-film transistors, a display element layer on which display elements are located, and a sealing member for sealing the display element layer. In this case, the display unit may be the same as or similar to that described with reference to FIG. 2.

The display layer DISL may be divided into the display area DA and a peripheral area NDA. The display area DA may be an area in which pixels are arranged to display an image. The peripheral area NDA may be an area that is outside the display area DA and does not display an image. The peripheral area NDA may be arranged to surround the display area DA. The peripheral area NDA may be an area from the outside of the display area DA to an edge of the display panel DP. In addition to pixels, pixel circuits driving pixels, scan lines, data lines, and power lines connected to the pixel circuits, or the like may be arranged in the display area DA. A scan driving unit configured to apply scan signals to the scan lines, fan-out lines connecting the data lines to the display driving unit 52, or the like may be arranged in the peripheral area NDA.

The touch screen layer TSL may be located on the display layer DISL. The touch screen layer TSL may be a layer including touch electrodes and configured to sense whether a user touches. The touch screen layer TSL may be directly formed on a sealing member of the display layer DISL. Alternatively, the touch screen layer TSL may be separately formed and then coupled to the sealing member of the display layer DISL through an adhesive layer such as an optically clear adhesive (OCA).

The optical functional layer OFL may be located on the touch screen layer TSL. The optical functional layer OFL may include an anti-reflection layer. The anti-reflection layer may reduce the reflectance of light (external light) incident from the outside toward the display device 1.

In some embodiments, the anti-reflection layer may include a polarizing film. The polarizing film may include a linear polarizing plate and a retardation film, such as a quarter-wave plate. The retardation film may be located on the touch screen layer TSL, and the linear polarizing plate may be located on the retardation film.

In some embodiments, the anti-reflection layer may include a filter layer including a black matrix and color filters. The color filters may be arranged considering a color of light emitted from each of the pixels of the display device 1. For example, the filter layer may include a red, green, or blue filter.

In some embodiments, the anti-reflection layer may include a destructive interference structure. The destructive interference structure may include a first reflective layer and a second reflective layer, which are arranged on different layers. First reflected light and second reflected light respectively reflected from the first reflective layer and the second reflective layer may destructively interfere, and thus, the reflectance of external light may be reduced.

The cover window 500 may be located on the optical functional layer OFL. The cover window 500 may be attached to the optical functional layer OFL by a transparent adhesive member, such as an OCA film.

The panel protective member PB may be located below the display panel DP. The panel protective member PB may be attached to the lower surface of the display panel DP through an adhesive member. The adhesive member may include a pressure sensitive adhesive (PSA). The panel protective member PB may include at least one of a light absorption layer for absorbing light incident from the outside, a cushion layer for absorbing an impact from the outside, or a heat radiation layer for relatively efficiently emitting heat of the display panel DP.

The light absorption layer may be located below the display panel DP. The light absorption layer blocks light transmission to prevent components located below the light absorption layer, for example, the display circuit board 51, from being viewed from above the display panel DP. The light absorption layer may include a light-absorbing material, such as a black pigment or a black dye.

The cushion layer may be located below the light absorption layer. The cushion layer absorbs an external impact to prevent the display panel DP from being damaged. The cushion layer may include a single layer or a plurality of layers. For example, the cushion layer may include a polymer resin, such as polyurethane, polycarbonate, polypropylene, polyethylene, r the like, or may include a material having elasticity, such as rubber, an urethane material, or a sponge formed by foam molding an acrylic material, or the like.

The heat radiation layer may be located below the cushion layer. The heat radiation layer may include a first heat radiation layer including graphite, carbon nanotubes, or the like, and a second heat radiation layer including a metal thin film, such as copper, nickel, ferrite, or silver, which may shield electromagnetic waves and has excellent thermal conductivity.

The flexible film 54 may be arranged in the peripheral area NDA on an edge of the display panel DP. The flexible film 54 may be bent below the display panel DP, and the display circuit board 51 may be located below the panel protective member PB. The display circuit board 51 may be attached and fixed to a lower surface of the panel protective member PB through a first adhesive member 59. The first adhesive member 59 may be a PSA.

A display device and an electronic device according to embodiments may not only provide a clear image but may also reduce an impact applied to an edge of a substrate of the display device.

A method of manufacturing a display device according to embodiments may relatively smoothly separate a substrate into different portions, thereby preventing or reducing damage to the substrate. In addition, the method of manufacturing a display device according to embodiments may shorten the manufacturing time and reduce costs associated with manufacturing the display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:

a substrate;

a display unit on the substrate; and an encapsulation member on the display unit, wherein the substrate comprises:

a first inclined surface inclined with respect to a first surface of the substrate; and a first side surface connected to the first inclined surface and arranged at a predetermined angle from the first inclined surface, wherein a surface roughness of the first side surface is different from a surface roughness of the first inclined surface.

2. The display device of claim 1, wherein a surface roughness of the first surface of the substrate, the first surface being connected to the first inclined surface, is different from the surface roughness of the first inclined surface.

3. The display device of claim 1, wherein the substrate further comprises a second inclined surface connected to the first side surface and inclined with respect to the first surface of the substrate.

4. The display device of claim 1, wherein an angle of the first inclined surface with respect to the first surface of the substrate is different from an angle of the second inclined surface with respect to a second surface of the substrate.

5. The display device of claim 3, wherein a sum of a first angle between the first surface of the substrate and the first inclined surface, a second angle between the first inclined surface and the first side surface, and a third angle between a second surface of the substrate and the second inclined surface is less than 450 degrees, the second surface being opposite to the first surface.

6. The display device of claim 1, wherein a height from the first surface of the substrate to an end of the first inclined surface is less than half of a thickness of the substrate.

7. The display device of claim 1, wherein the encapsulation member comprises a thin-film encapsulation layer.

8. The display device of claim 1, wherein the encapsulation member comprises:

an encapsulation substrate facing the substrate; and a sealing portion between the substrate and the encapsulation substrate and sealing the display unit.

9. The display device of claim 8, wherein the encapsulation substrate comprises:

a third inclined surface inclined with respect to a first surface of the encapsulation substrate; and a second side surface connected to the third inclined surface and arranged at a predetermined angle from the third inclined surface.

10. The display device of claim 9, wherein a surface roughness of the second side surface is different from a surface roughness of the third inclined surface.

11. The display device of claim 9, wherein a surface roughness of the first surface of the encapsulation substrate, the first surface being connected to the third inclined surface, is different from a surface roughness of the third inclined surface.

12. The display device of claim 9, wherein the encapsulation substrate further comprises a fourth inclined surface connected to the second side surface and inclined with respect to the first surface of the encapsulation substrate.

13. The display device of claim 12, wherein an angle of the third inclined surface with respect to the second side surface is different from an angle of the fourth inclined surface with respect to the second side surface.

14. The display device of claim 12, wherein a sum of a fourth angle between the first surface of the encapsulation substrate and the third inclined surface, a fifth angle between the third inclined surface and the second side surface, and a sixth angle between a second surface of the encapsulation substrate and the fourth inclined surface is less than 450 degrees, the second surface being opposite to the first surface of the encapsulation substrate.

15. The display device of claim 9, wherein a height from a surface of the encapsulation substrate to an end of the third inclined surface is less than half of a thickness of the encapsulation substrate.

16. The display device of claim 9, wherein the third inclined surface comprises a plurality of inclined surfaces having different angles from each other with respect to a surface of the encapsulation substrate.

17. The display device of claim 1, wherein the first inclined surface comprises a plurality of inclined surfaces having different angles from each other with respect to a surface of the substrate.

18. An electronic device comprising:

a cover member;

a cover coupled to the cover member; and a display device inside the cover member and the cover, wherein the display device comprises the display device according to claim 1.

* * * * *